United States Patent [19]

Nomura et al.

[11] Patent Number: 5,594,699
[45] Date of Patent: Jan. 14, 1997

[54] DRAM WITH REDUCED ELECTRIC POWER CONSUMPTION

[75] Inventors: Yukihiro Nomura; Yasuharu Satoh; Yoshihiro Takemae, all of Kawasaki; Takaaki Furuyama, Kasugai; Mitsuhiro Nagao, Kasugai; Masahiro Niimi, Kasugai, all of Japan

[73] Assignees: Fujitsu Limited, Kawasaki; Fujitsu Vlsi Limited, Kasugai, both of Japan

[21] Appl. No.: 308,105

[22] Filed: Sep. 16, 1994

[30] Foreign Application Priority Data

Sep. 20, 1993 [JP] Japan .................................. 5-233860
Jan. 27, 1994 [JP] Japan .................................. 6-007937

[51] Int. Cl.$^6$ ...................................................... G11C 7/00
[52] U.S. Cl. .................................... 365/226; 365/222
[58] Field of Search ................................ 365/226, 203, 365/222

[56] References Cited

U.S. PATENT DOCUMENTS

| 4,943,960 | 7/1990 | Komatsu | 365/222 |
| 5,132,932 | 7/1992 | Tobita | 365/222 |
| 5,337,282 | 8/1994 | Koike | 365/222 |

*Primary Examiner*—A. Zarabian
*Attorney, Agent, or Firm*—Armstrong, Westerman, Hattori, McLeland & Naughton

[57] ABSTRACT

A DRAM (Dynamic Random Access Memory) having a plurality of memory cells includes a data read/write circuit reading or writing data for the memory cells, a self-refresh circuit refreshing data stored in the memory cells, and a power supply unit for supplying electric power to the data read/write circuit and the self-refresh circuit, the electric power having a first voltage level in a normal operation mode and a second voltage level in a self-refresh mode, wherein the second voltage level is lower than the first voltage level.

4 Claims, 28 Drawing Sheets

PRIOR ART
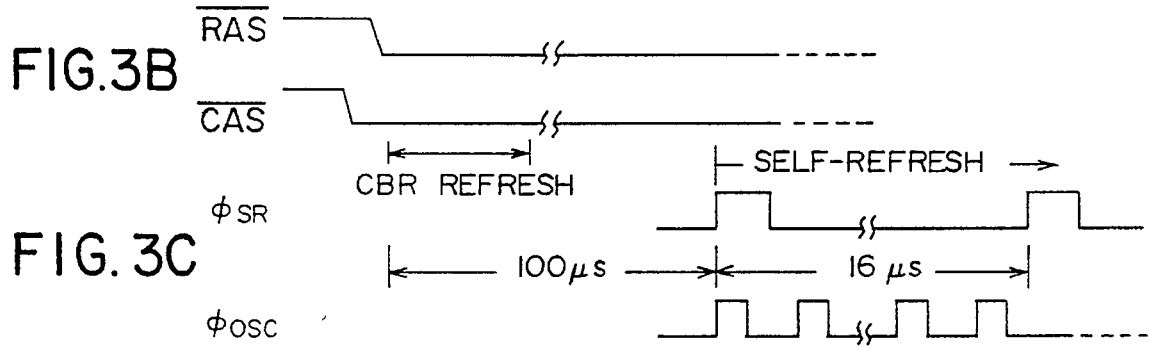

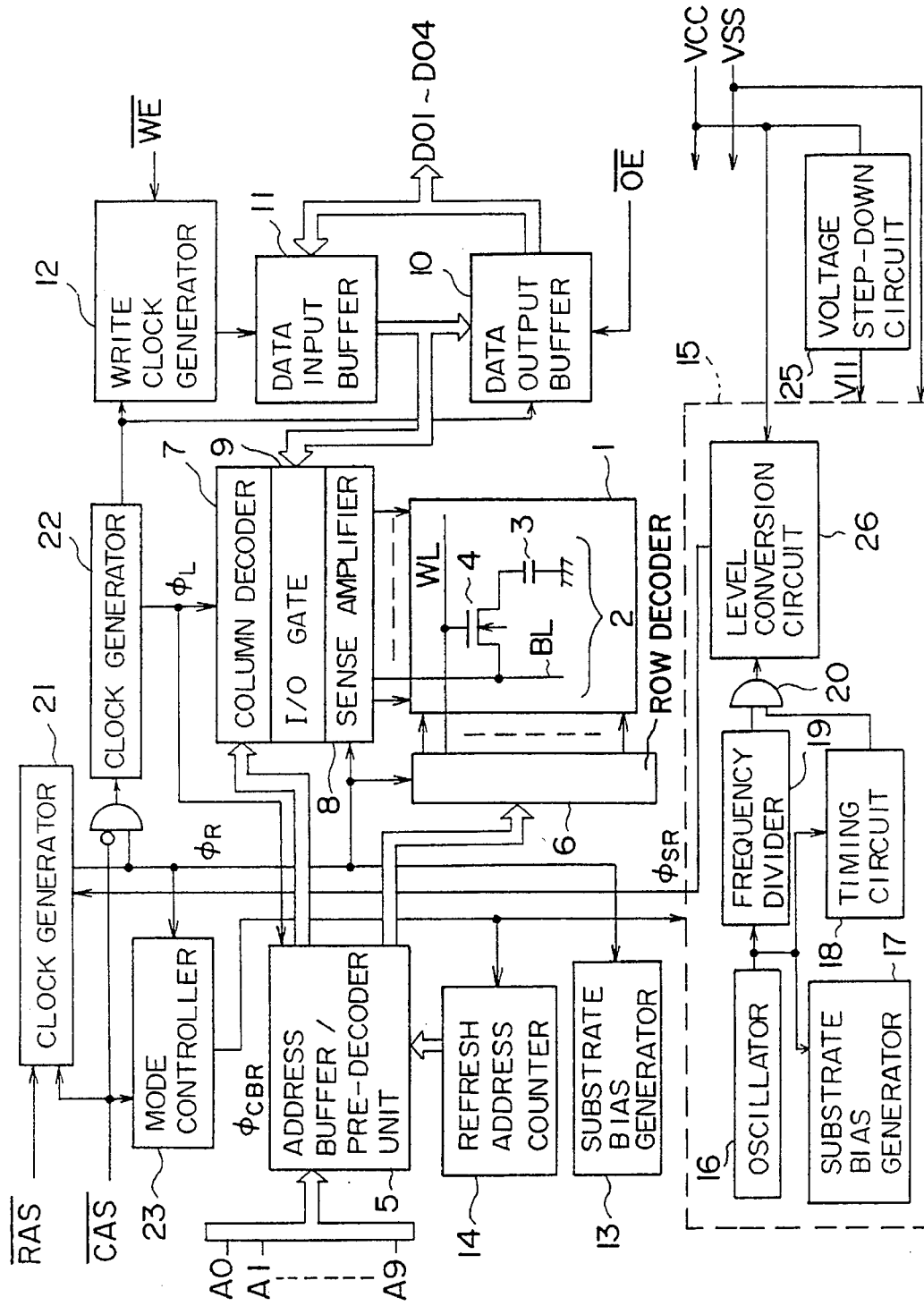

PRIOR ART
FIG. 5A
FIG. 5B
FIG. 5C
FIG. 5D
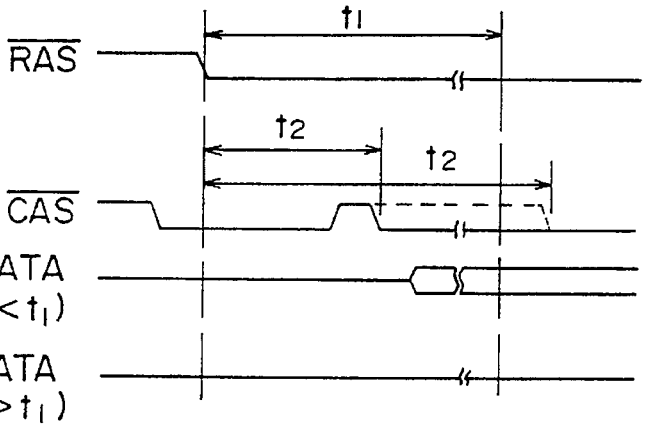
FIG. 7
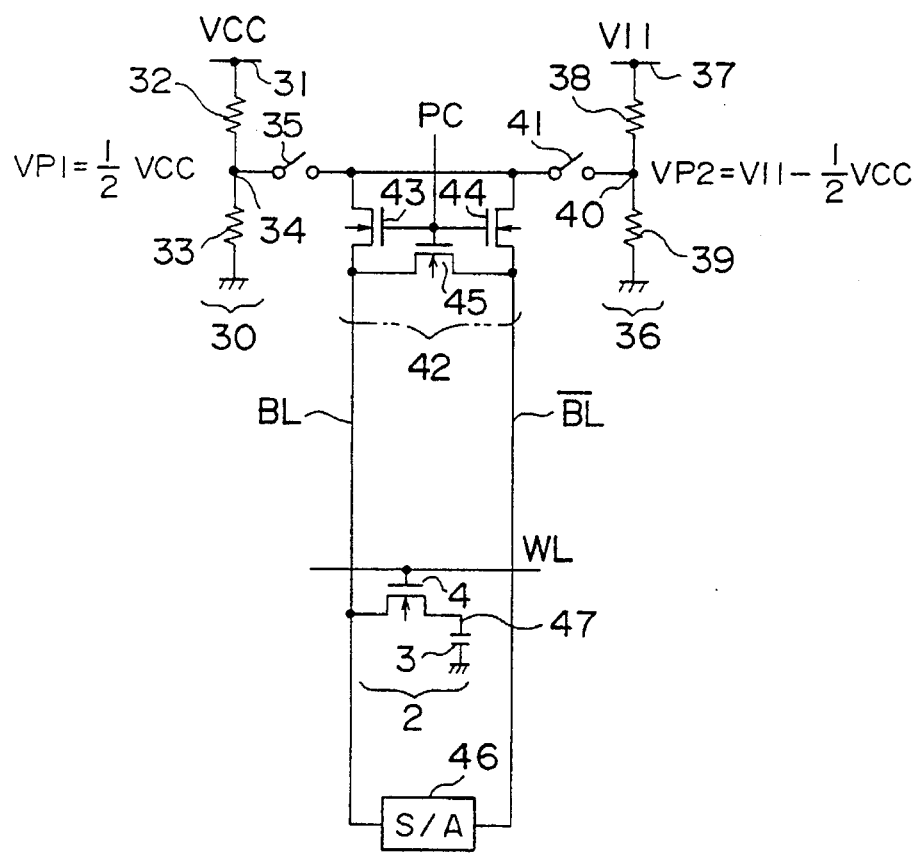

FIG. 10A
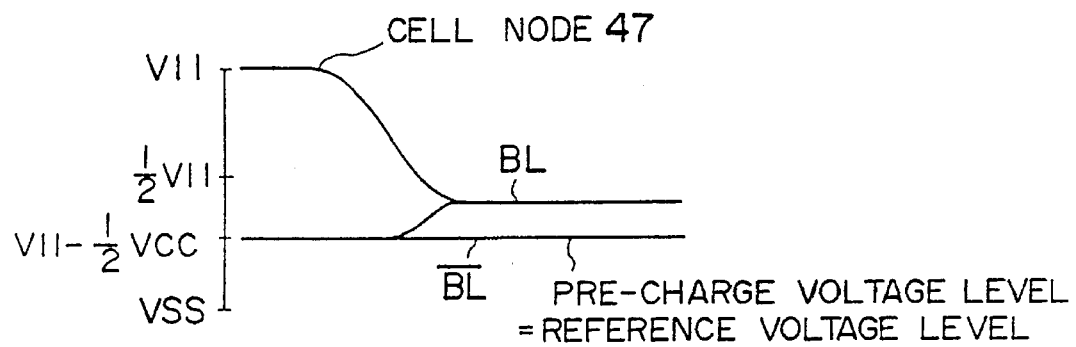
FIG. 10B
FIG. 11
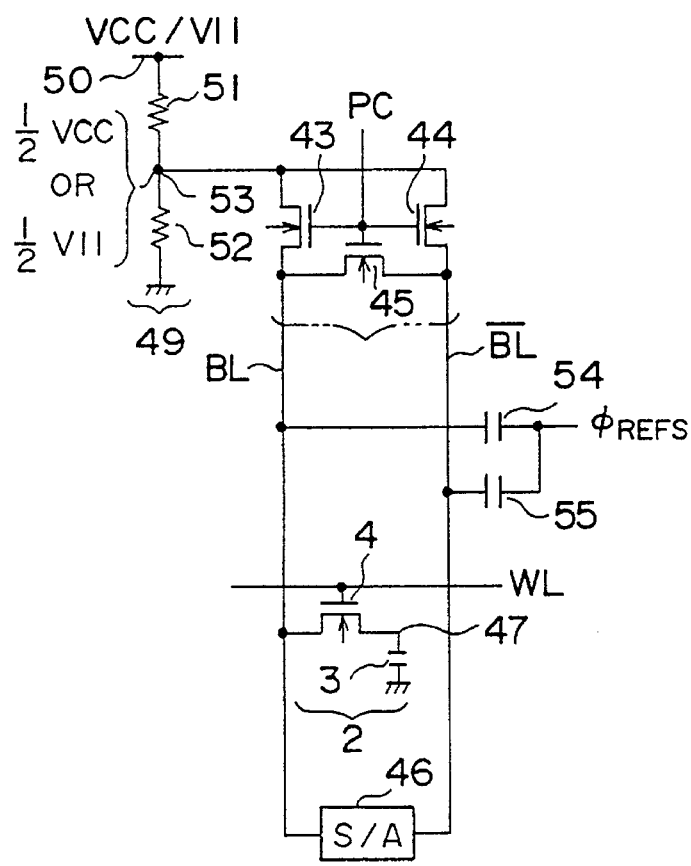

FIG. 14
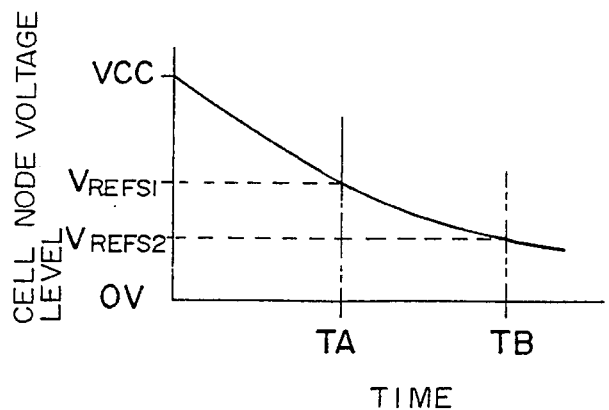
FIG. 15A
FIG. 15B
FIG. 15C
FIG. 15D
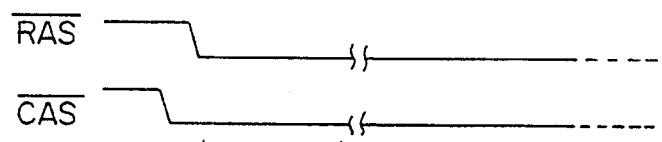
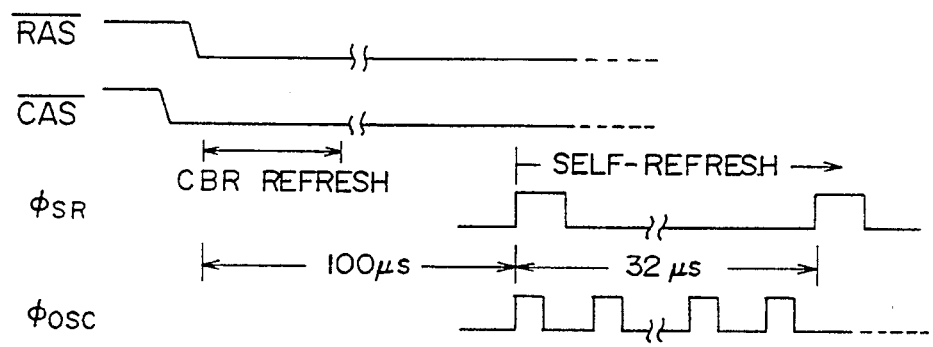

FIG. 17A
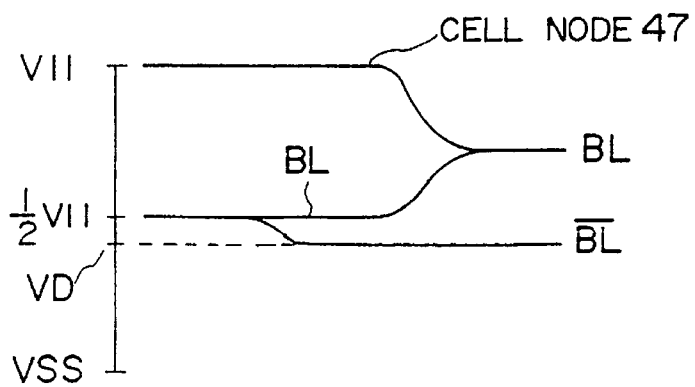
FIG. 17B
FIG. 17C
FIG. 17D
FIG. 17E
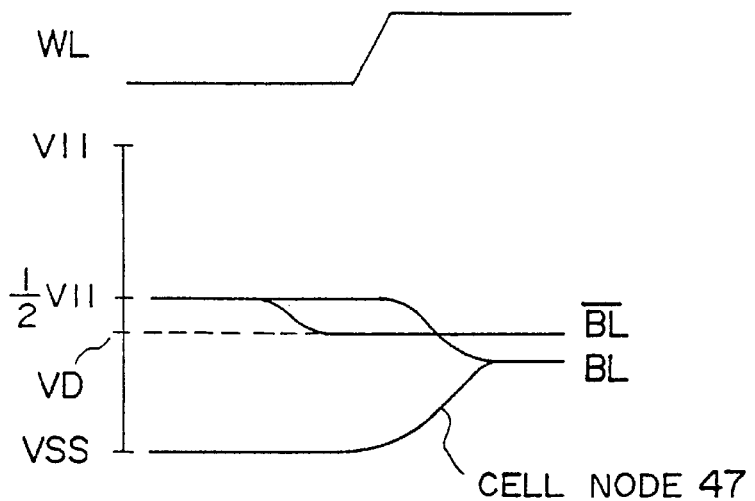

F I G. 20
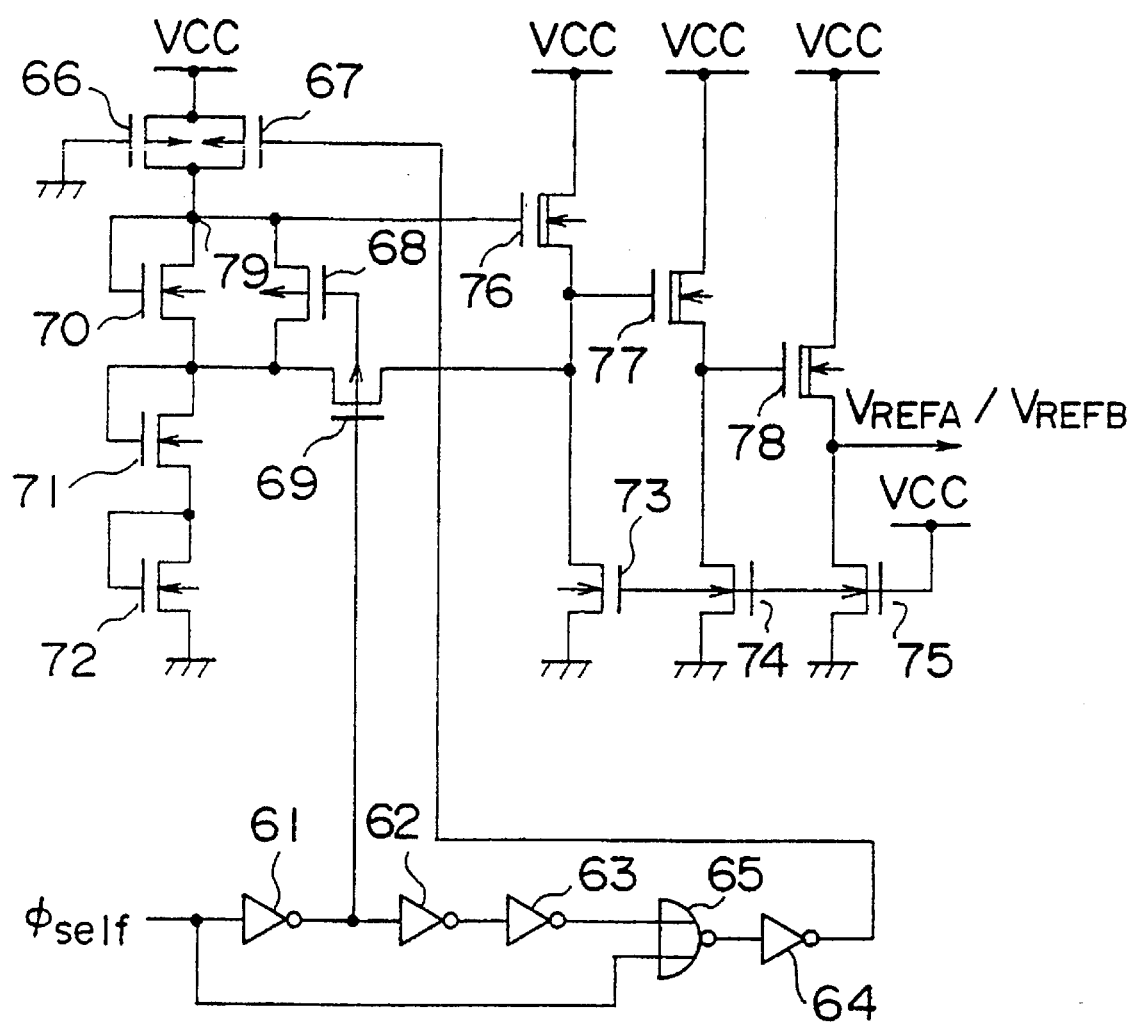

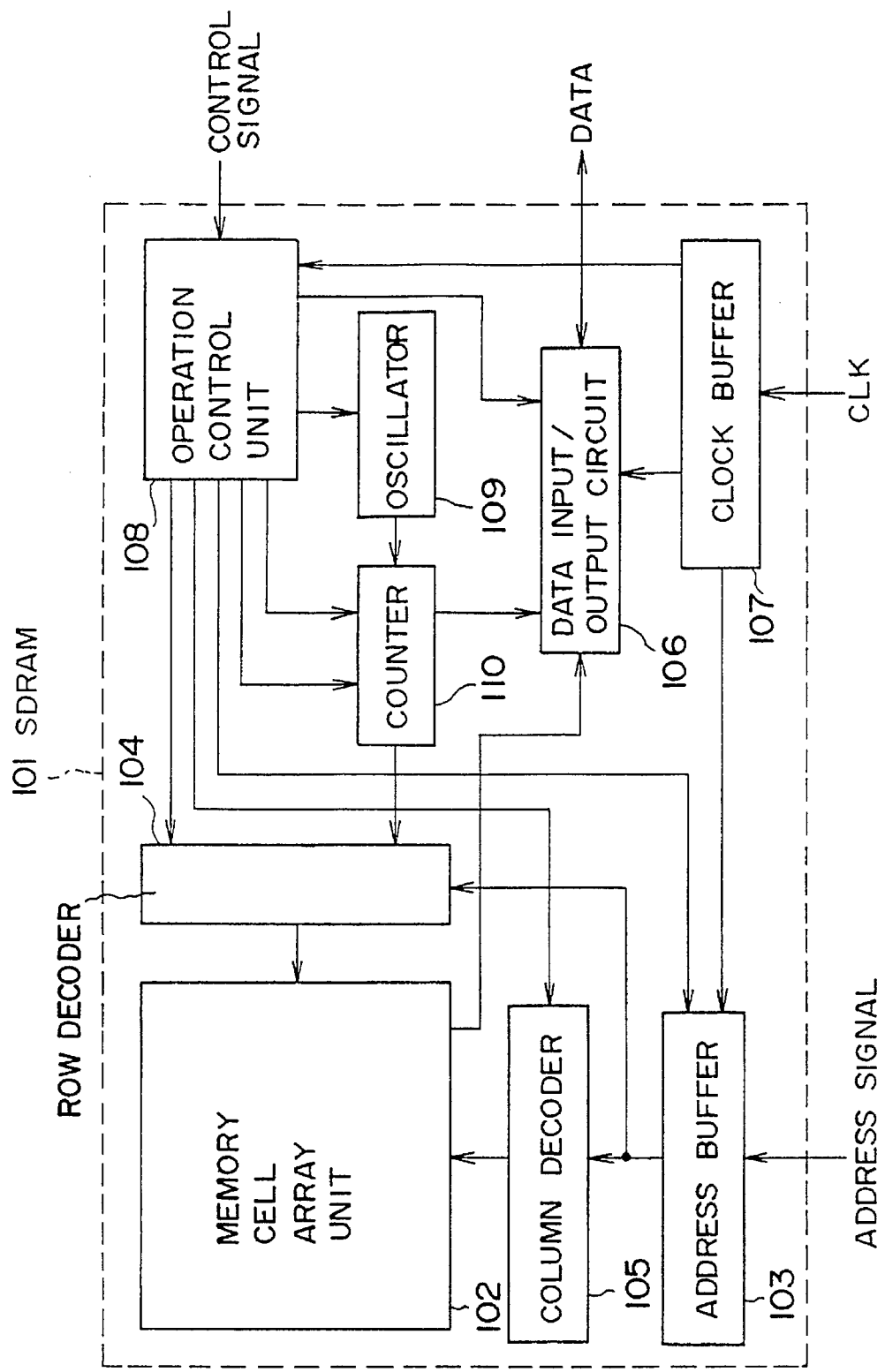

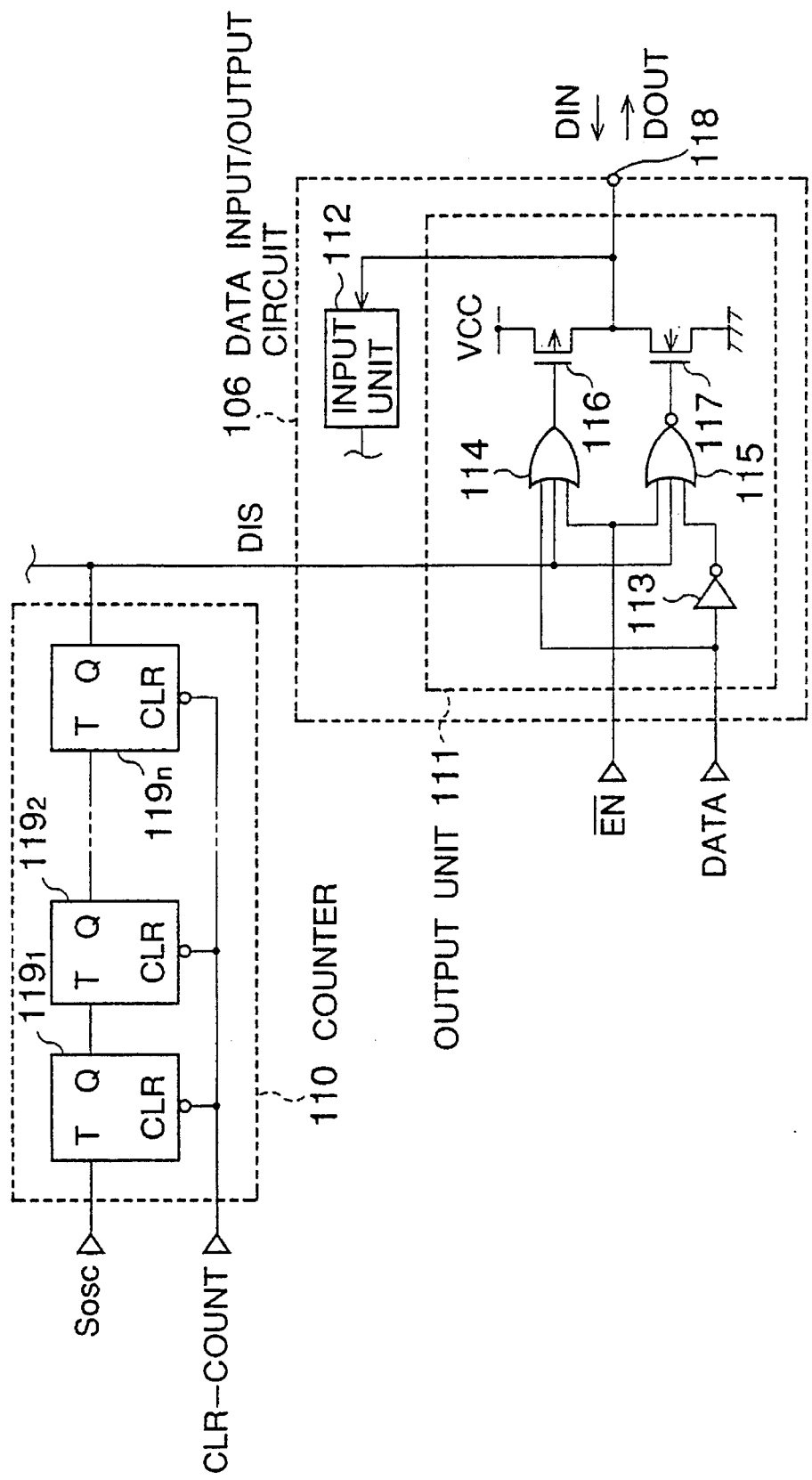
F I G. 2 5

CLR-COUNT

Sosc

Q

F I G. 3 6
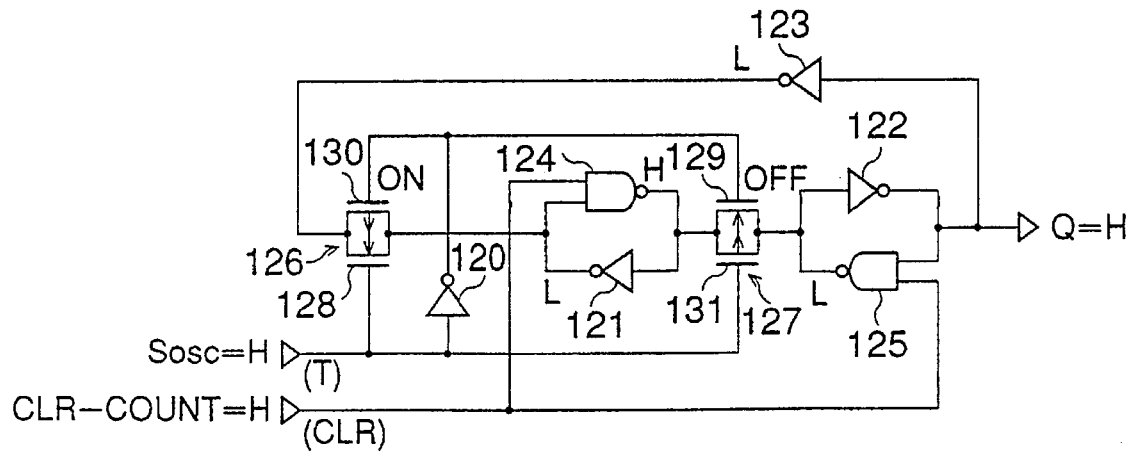
F I G. 3 7
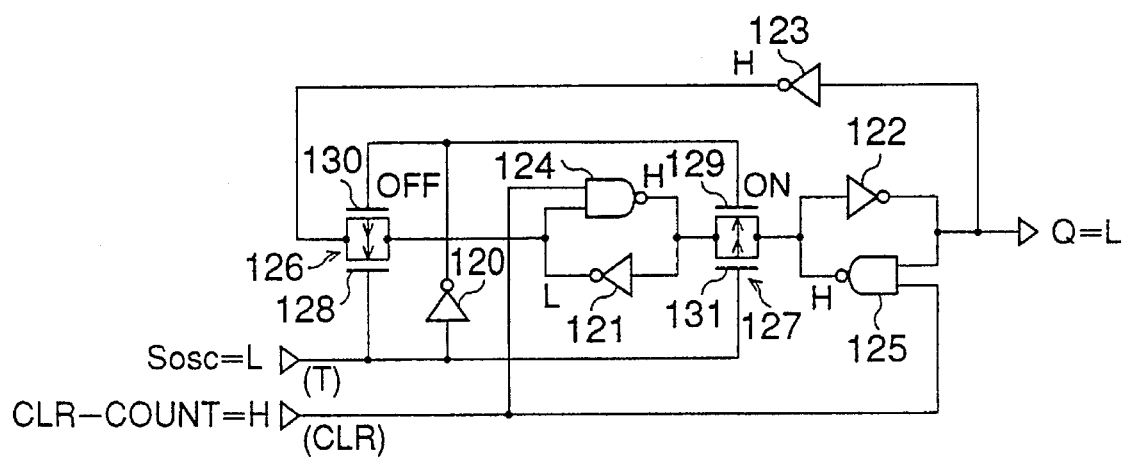

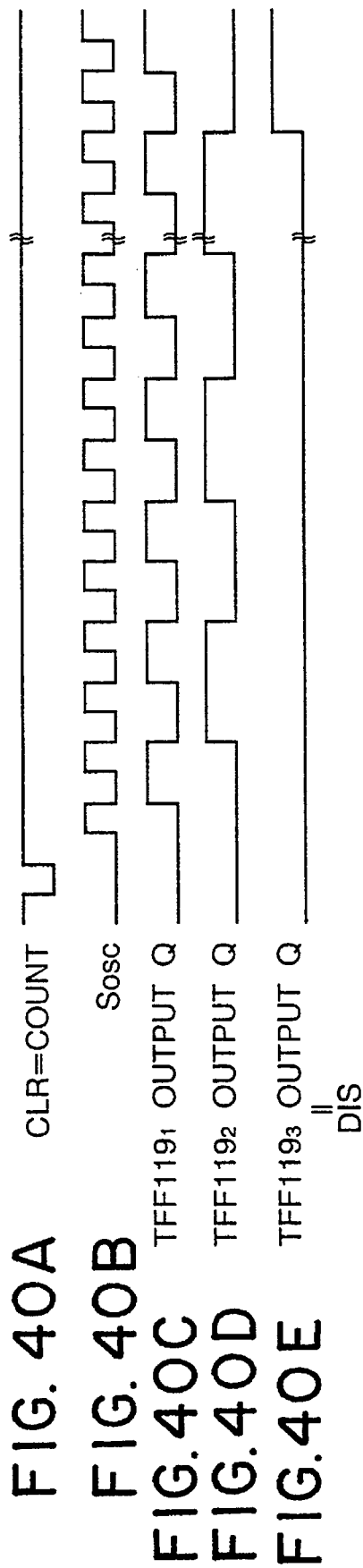

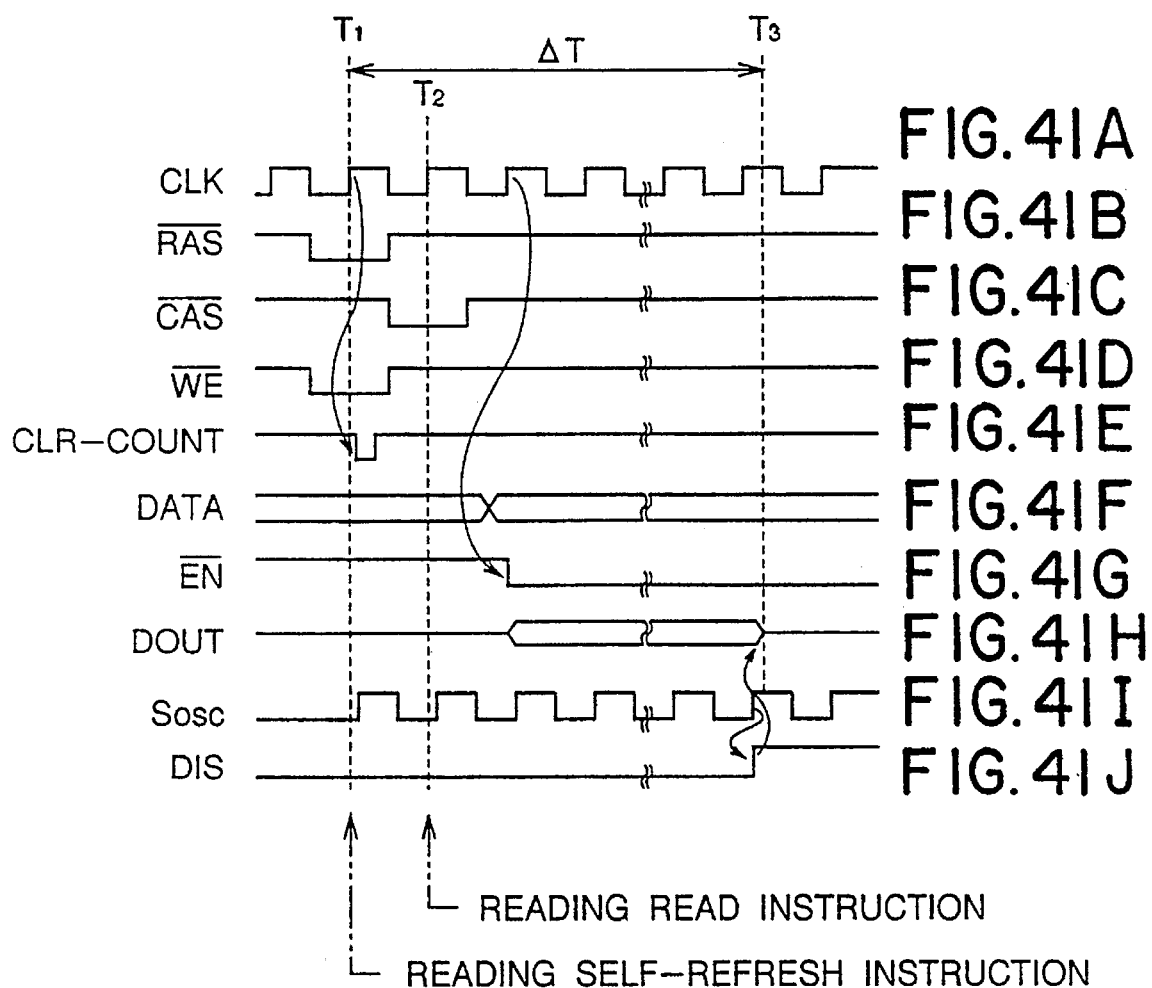

DRAM WITH REDUCED ELECTRIC POWER CONSUMPTION

BACKGROUND OF THE INVENTION

1. Field of the Invention

The present invention generally relates to RAMs (Random Access Memory), and particularly relates to a DRAM (Dynamic Random Access Memory) which can carry out a self-refresh operation.

2. Description of the Prior Art

A block diagram of a DRAM of the prior art is shown in FIG. 1. In FIG. 1, the DRAM comprises a memory cell array unit 1, which includes a memory cell 2, a capacitor 3 for electric charge, an n-channel MOS (Metal Oxide Semiconductor) transistor 4 functioning as a transfer gate, a word line WL, and a bit line BL.

The DRAM further comprises an address buffer/pre-decoder unit 5. The address buffer/pre-decoder unit 5 includes an address buffer for reading an address signal and a pre-decoder for pre-decoding a row address signal which is part of the address signal read by the address buffer.

The DRAM further comprises a row decoder 6, column decoder 7, a sense amplifier circuit 8, and an I/O gate 9. The row decoder decodes a pre-decode signal provided from the pre-decoder of the address buffer/pre-decoder unit 5 so as to select one among many word lines WL. The column decoder 7 decodes a column address signal provided from the address buffer of the address buffer/pre-decoder unit 5 so as to supply a column selection signal for selecting a column. The sense amplifier circuit 8 amplifies signals read from the memory cell array unit 1, and the I/O gate 9 selects a column on the basis of the column selection signal provided by the column decoder 7.

The DRAM further comprises a data output buffer 10, a data input buffer 11, and a write-clock generator 12. The data output buffer 10 latches data read from the memory cell array unit 1 so as to provide output data DO1-DO4, where /OE ("/" is used herein for indicating that the signal is that of a negative logic) is an output enable signal provided externally for controlling the data output buffer 10. The data input buffer 11 reads and stores data to be written which is provided externally. The write-clock generator 12 provides a write-clock signal for controlling the operation of the data input buffer 11, where /WE is a write enable signal provided externally for controlling a write operation.

The DRAM further comprises a substrate bias generator 13 for generating a substrate bias voltage, a refresh address counter 14 for providing an address signal used in a refresh operation, a self-refresh circuit 15 used for a self-refresh operation. The self-refresh circuit 15 includes an oscillator 16, a substrate bias generator 17, a timing circuit 18, a frequency divider 19, and an AND gate 20.

The DRAM further comprises a clock generator 21 for supplying a clock signal to the row decoder 6, the sense amplifier circuit 8, the substrate bias generator 13, etc. The DRAM further comprises a clock generator 22 for supplying a clock signal to the address buffer of the address buffer/pre-decoder unit 5, the column decoder 7, the write-clock generator 12, etc. Here, /RAS is a row address strobe signal, and /CAS is a column address strobe signal, both provided externally.

The DRAM further comprises a mode controller 23. When selecting a CBR (CAS Before RAS) refresh mode on the basis of a clock signal provided by the clock generator 21 and the column address strobe signal /CAS, the mode controller 23 sends the CBR refresh mode signal $\emptyset_{CBR}$ to the self-refresh circuit 15.

In FIG. 1, VCC is an external power voltage level such as for example 3.3 V, and VSS is a ground level of 0 V, both provided externally.

FIG. 2 shows signals when the DRAM is operating in a normal operation mode. As shown in FIG. 2, a normal operation mode is carried out when the column address strobe signal /CAS changes from a high level to a low level after the row address strobe signal /RAS changes from the high level to the low level.

FIG. 3 shows signals when the DRAM is operating in a refresh mode. As shown in FIG. 3, the CBR refresh mode is enacted when the column address strobe signal /CAS changes from the high level to the low level after the row address strobe signal /RAS changes from the high level to the low level.

Actually, the self-refresh mode is enacted when 100 μsec passes after the above signal changes while both of the /CAS and /RAS signals stay at the low level. Each self-refresh operation is carried out at a predetermined interval such as for example 16 μsec.

In FIG. 3, $\emptyset_{OSC}$ is a signal provided by the oscillator 16, and $\emptyset_{SR}$ is a signal provided by the AND gate 20 for controlling self-refresh cycles.

In the DRAM shown in FIG. 1, the external power voltage level VCC is provided for all the components mentioned above not only when the DRAM is operating in the normal operation mode but also when it is operating in the self-refresh mode. Thus, the electric power consumed by the DRAM tends to be large, which raises a problem of shortening the life of back-up battery when such DRAM is used for portable equipment such as personal computers of laptop types.

In order to obviate this problem, a voltage step-down circuit 25 is provided in a DRAM of the prior art, as shown in FIG. 4, for providing the self-refresh circuit 15 with a lowered voltage level VII which is made by lowering the voltage level of the power voltage level VCC. In this manner, an electric power consumption in the DRAM is reduced in the prior art. Here, a level conversion circuit 26 provided in the self-refresh circuit 15 converts the VII level of the self-refresh cycle signal $\emptyset_{SR}$ from the AND gate 20 into the VCC level (the external power voltage level).

In the DRAM shown in FIG. 4, the electric power consumption of the self-refresh circuit 15 can be reduced, and the overall electricity consumption can be lowered. Such amount of a reduction in electricity consumption as achieved by this method, however, is not sufficient for such DRAM to be able to be used in portable equipment like laptop personal computers. Thus, a further reduction in electricity consumption needs to be achieved.

While FIG. 3 is used for the description of the self-refresh mode of the DRAM of FIG. 1, a transition from the normal operation mode to the self-refresh mode is slightly different for another type of DRAMs. That is, FIG. 3 shows the activation of the self-refresh mode of an asynchronous DRAM, which is differs from that of a SDRAM (Synchronous DRAM). Unfortunately, using a SDRAM rises another problem as will be described below.

In DRAMs, a timer is necessary for controlling a refresh operation. In order for this timer to be accurate within a tolerance level, the oscillation frequency of the oscillator must be a right frequency. For assuring this, the oscillator is designed to allow a fine adjustment of a oscillation frequency by the cutting off of its fuses. As a step to be taken before this adjustment of the oscillation frequency, however, the cycle of the output signal of the counter should be measured.

When using an asynchronous DRAM, measuring the cycle of the counter output signal is carried out by utilizing a mode which is called a counter test cycle.

FIG. 5 shows signals for explaining the method of measuring the cycle of the counter output signal.

In order to measure the cycle of the counter output signal by using the counter test cycle, the column address strobe signal /CAS is changed from the high level to the low level, and, then, the row address strobe signal /RAS is changed from the high level to the low level.

As described before with reference to FIG. 3, the CBR cycle is set by the changes of the signal levels described above. When a predetermined length of time such as for example 100 μsec passes without any changes in the signal levels, the self-refresh cycle is enacted, where the output of the data output buffer is made a high impedance state, thus prohibiting the output of any data. When the CBR cycle is set, the counter start keeping count of the oscillator output, and measures 100 μsec from the moment when the row address strobe signal /RAS became the low level.

If the column address strobe signal /CAS is made the high level again after the setting of the CBR cycle, and if the column address strobe signal /CAS is changed to the low level again before the 100 μsec passes, the output of the data output buffer becomes a data output state as shown in FIG. 5.

On the other hand, even if the column address strobe signal /CAS is changed to the low level again after the 100 μsec passes, the output of the data output buffer is made a high impedance state. This is because the self-refresh cycle has been already enacted by this point of time.

Suppose measuring the output state of the data output buffer while gradually delaying the change of the column address strobe signal /CAS from the high level to the low level. At first, the output state should be the data output state. Then, the change of the column address strobe signal /CAS is delayed step by step until the output state becomes the high impedance state. With this condition, the time difference between the time of the row address strobe signal /RAS changing to the low level and the time of the column address strobe signal /CAS changing second time to the low level is the length of time which is recognized to be 100 μsec by the counter.

In this manner, the 100 μsec which the counter measures using its own clock signal can be measured, so that one cycle of the counter output signal can be known in the actual time scale. Since the counter is comprised of a frequency divider, the oscillating frequency of the oscillator can be calculated by taking into account the frequency dividing ratio of the frequency divider. Then, the oscillating frequency of the oscillator can be adjusted to obtain a proper cycle of the counter output signal.

However, differing from asynchronous DRAMs, SDRAMs start a self-refresh operation having a cycle such as for example 16 μsec immediately upon receiving a self-refresh instruction as a mode selection instruction.

Accordingly, it is impossible for SDRAMs to set a counter test cycle as in asynchronous DRAMs, and the problem is that there is no easy method of measuring the cycle of the counter output signal for SDRAMs.

Accordingly, there is a need in the field of the DRAM for a DRAM in which the consumption of electric power can be further reduced so that a back-up battery can be used for a longer time when such DRAM is used for portable equipment such as laptop type personal computer, thus enhancing the usefulness of such equipment.

Also, there is a need in the field of the DRAM for a DRAM which provides a simple method of measuring a cycle of the counter output signal so that the oscillating frequency of an oscillator can be adjusted to obtain a proper cycle of the counter output signal.

SUMMARY OF THE INVENTION

Accordingly, it is a general object of the present invention to provide a DRAM which satisfies the needs described above.

It is another and more specific object of the present invention to provide a DRAM in which the consumption of electric power can be further reduced so that a back-up battery can be used for a longer time when such DRAM is used for portable equipment such as laptop type personal computer, thus enhancing the usefulness of such equipment.

In order to achieve the above objects, a DRAM (Dynamic Random Access Memory) having a plurality of memory cells according to the present invention includes a data read/write circuit reading or writing data for the memory cells, a self-refresh circuit refreshing data stored in the memory cells, and a power supply unit for supplying electric power to the data read/write circuit and the self-refresh circuit, the electric power having a first voltage level in a normal operation mode and a second voltage level in a self-refresh mode, wherein the second voltage level is lower than the first voltage level.

Since the DRAM according to the present invention supplies the lower voltage level not only to the self-refresh circuit but also to the data read/write circuit in the self-refresh mode, a further reduction in electric power consumption can be achieved compared to the DRAM of the prior art. Thus, the DRAM used in portable equipment such as laptop type personal computers can enhance the usefulness of such equipment.

It is yet another object of the present invention to provide a DRAM which provides a simple method of measuring a cycle of the counter output signal so that the oscillating frequency of an oscillator can be adjusted to obtain a proper cycle of the counter output signal.

In order to achieve the above object, according to the present invention, a DRAM having a data output circuit and a timer for controlling a refresh operation with control signals which are in synchronism with a system clock includes an oscillator generating an oscillating signal, and a counter counting the oscillating signal, the counter starting counting the oscillating signal upon receiving a predetermined instruction, and making an output of the data output circuit a high impedance state or a data output state when a result of counting the oscillating signal becomes a predetermined number, so that the oscillating frequency can be precisely estimated.

Thus, this DRAM according to the present invention can provide a simple method of measuring a cycle of the output signal of the counter, so that a fine adjustment of the oscillating frequency of the oscillator can be carried out to provide a cycle of a proper time length.

Other objects and further features of the present invention will be apparent from the following detailed description when read in conjunction with the accompanying drawings.

BRIEF DESCRIPTION OF THE DRAWINGS

FIG. 3 is an time chart showing signals for explaining the self-refresh mode of the DRAM of FIG. 1;

FIG. 4 is another block diagram of the DRAM of the prior art;

FIG. 5 is a time chart showing signals for explaining a prior art method of measuring a cycle of a counter output signal for an asynchronous DRAM;

FIG. 7 is a circuit diagram of the memory cell array unit of FIG. 6;

FIG. 10 is a time chart showing signals for explaining the operation of the first embodiment in the self-refresh mode;

FIG. 11 is a block diagram of a main part of a second embodiment of the present invention;

FIG. 14 is a graph showing a change in the voltage level of a cell node, when only the external power voltage level is supplied to the power line of FIG. 11;

FIG. 15 is a time chart showing signals for explaining the self-refresh mode when only the external power voltage level is supplied to the power line of FIG. 11;

FIG. 17 is a time chart showing signals for explaining the operation of the third embodiment in the self-refresh mode;

FIG. 20 is a circuit diagram of a reference voltage level generation circuit of FIG. 19;

FIG. 24 is a block diagram of a main part of a fifth embodiment of the present invention;

FIG. 25 is a circuit diagram of a data input/output circuit and a counter of FIG. 24;

FIG. 31 is a time chart for showing the operation of the T-flip-flop of FIG. 30;

FIG. 36 is a circuit diagram for showing the operation of the T-flip-flop of FIG. 30;

FIG. 37 is a circuit diagram for showing the operation of the T-flip-flop of FIG. 30;

FIG. 40 is a time chart showing signals for explaining the operation of the counter of FIG. 24; and FIG. 41 is a time chart showing signals for explaining a method of measuring a cycle of a counter output signal according to the fifth embodiment of the present invention.

DESCRIPTION OF THE PREFERRED EMBODIMENTS

Figure 1:
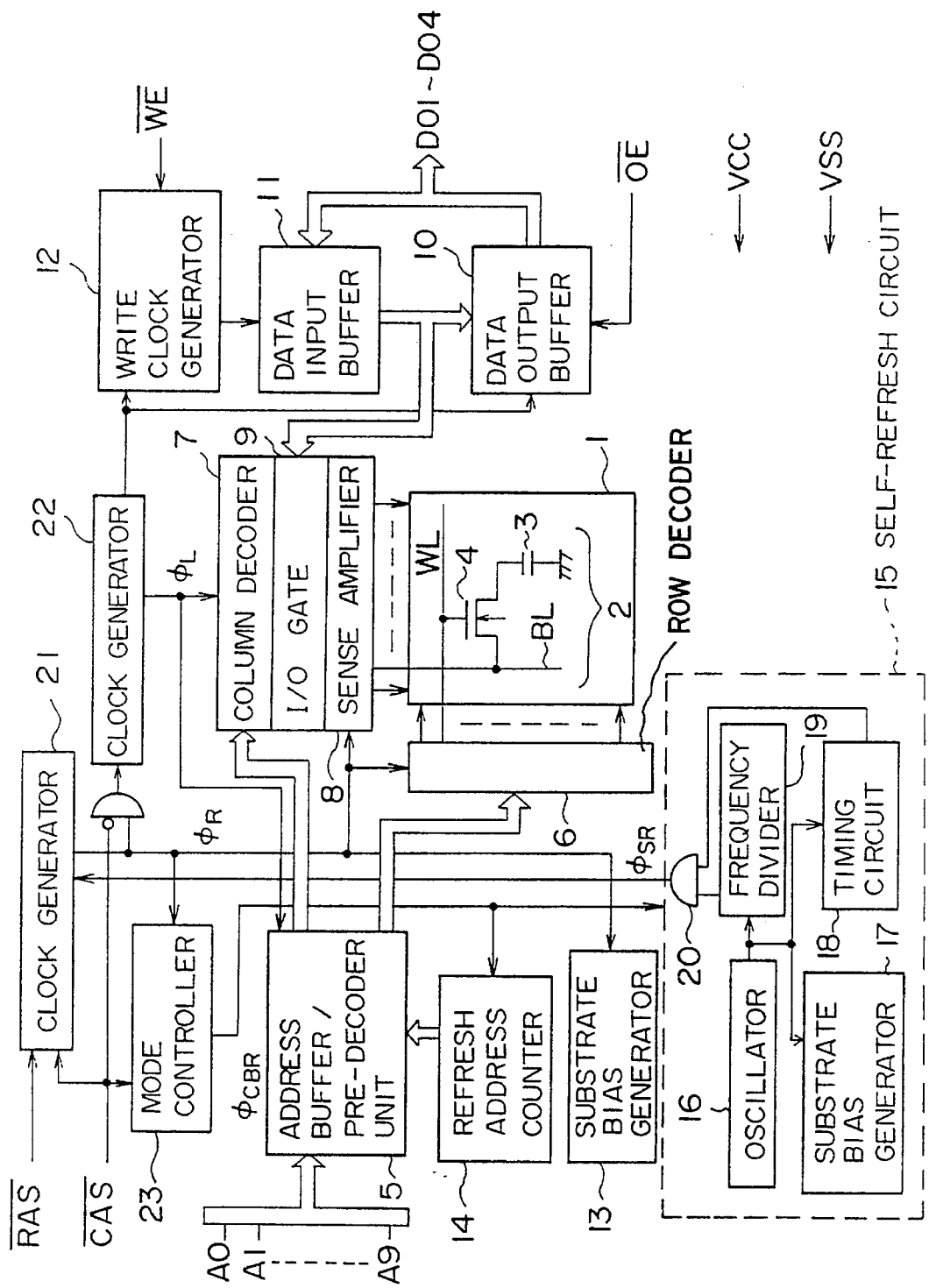
FIG. 1 is a block diagram of a DRAM of the prior art.
Figure 2A:
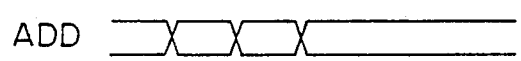
FIG. 2 is an time chart showing signals for explaining the operation of the DRAM of FIG. 1.
Figure 2B:
Figure 2C:
Figure 6:
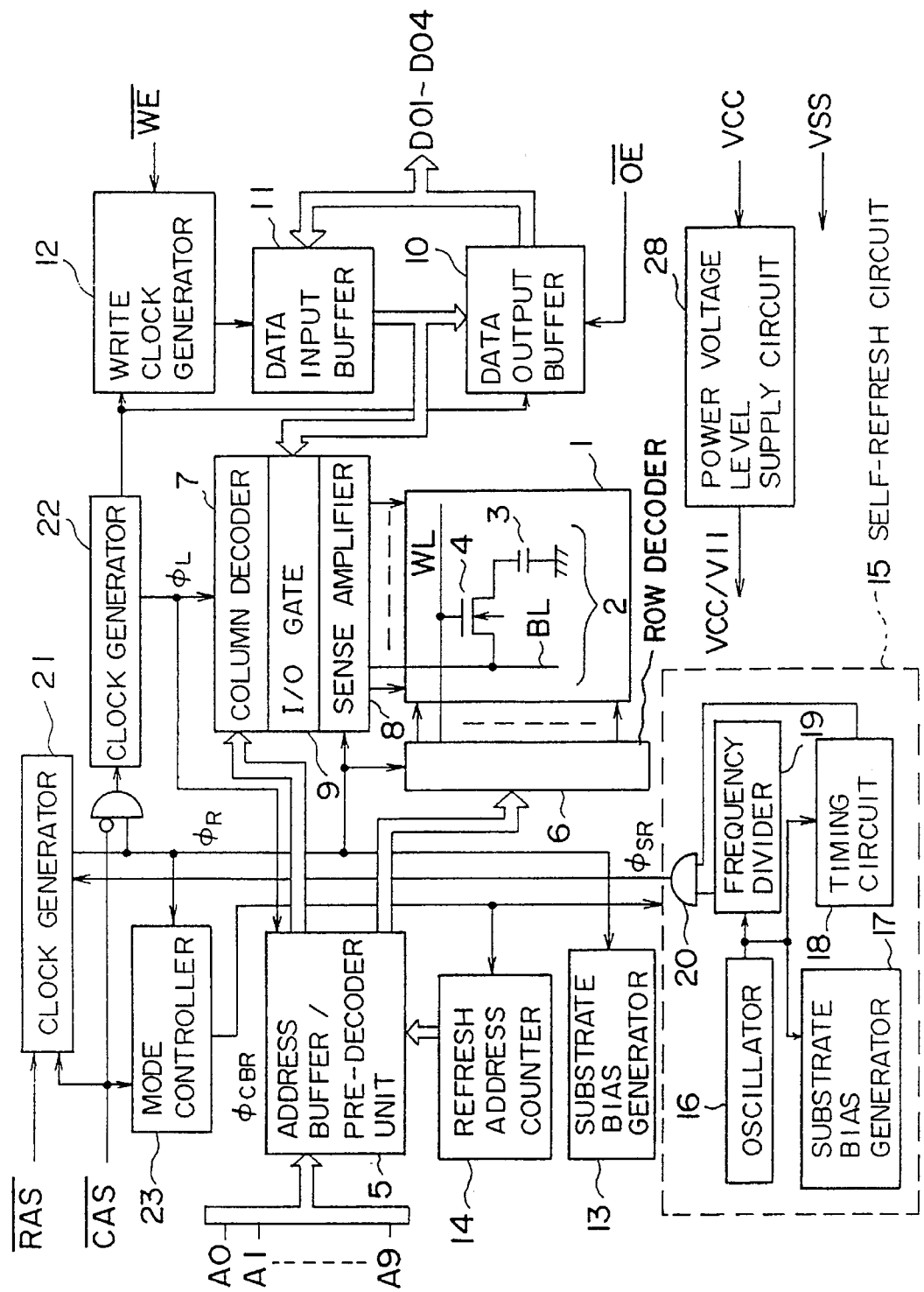
FIG. 6 is a block diagram of a main part of a first embodiment of the present invention.
Figure 18:
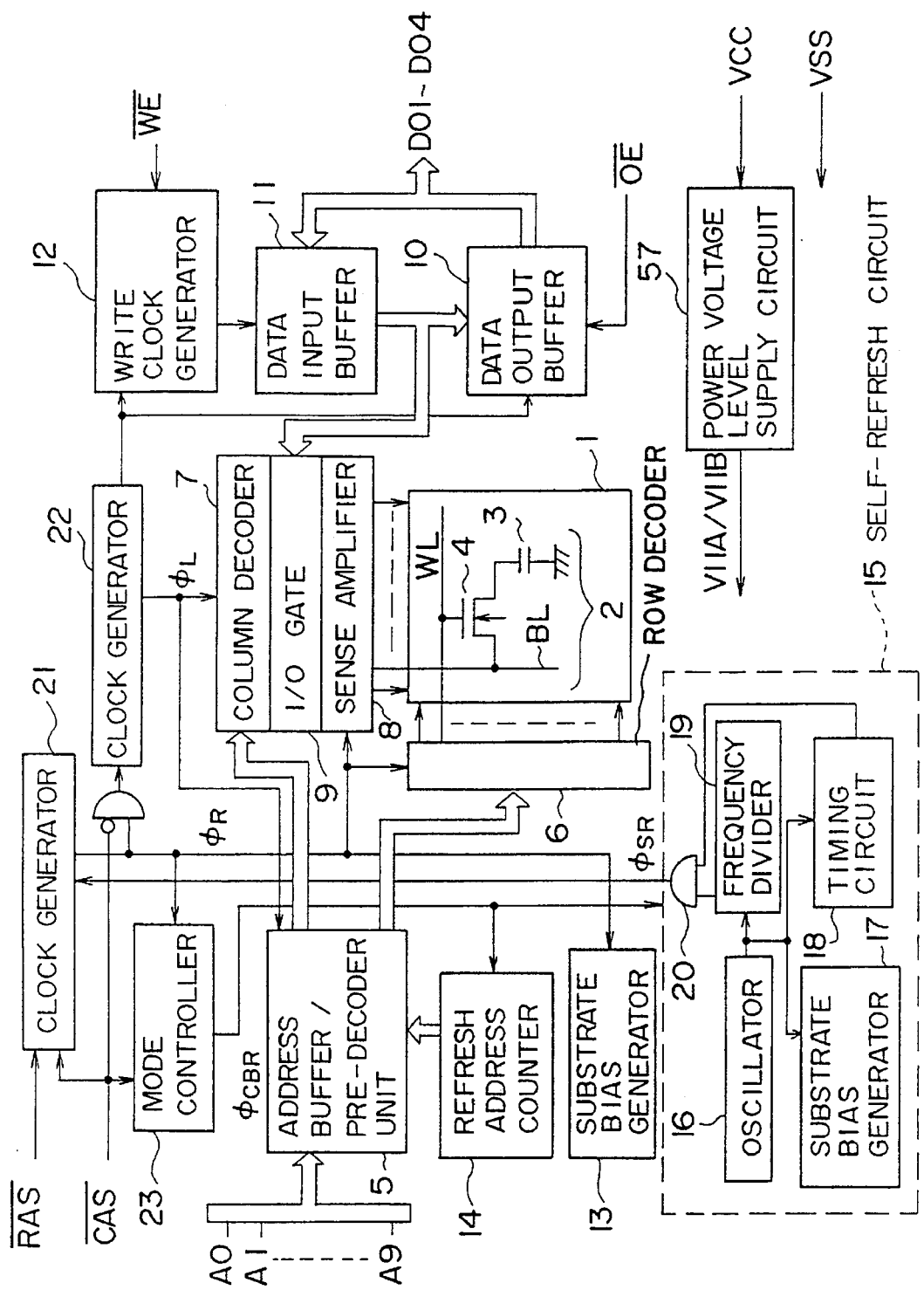
FIG. 18 is a block diagram of a main part of a fourth embodiment of the present invention.

A description of first through fourth embodiments of the present invention for reducing electric power consumption will be given with reference to FIG. 6 to FIG. 23. In FIG. 6 and FIG. 18, the same elements as those of FIG. 1 are referred to by the same numerals, and will be given no further description.

FIG. 6 shows a block diagram of the first embodiment of the present invention. This embodiment is provided with the power voltage level supply circuit 28, which differs from the prior art DRAM of FIG. 1.

In the normal operation mode, the power voltage level supply circuit 28 provides various internal circuits with the external power voltage level VCC provided externally. In the self-refresh mode, it provides the internal circuits with the lowered voltage level VII, which is made by lowering the voltage of the external power voltage level VCC.

In effect, however, a voltage higher than the external power voltage level VCC is applied to a selected word line by a voltage boosting circuit (not shown) in the normal operation mode. In the self-refresh mode also, a voltage higher than the lowered voltage level VII is applied to a selected word line by the voltage boosting circuit (not shown).

FIG. 7 shows a circuit of part of the memory cell array unit 1. In FIG. 7, a bit line pre-charge voltage generation circuit 30 is used in the normal operation mode, and a VCC power line 31 is used for providing the external power voltage level VCC. Resistors 32 and 33 have the same resistance.

As can be seen in FIG. 7, the bit line pre-charge voltage generation circuit 30 is designed to provide half the VCC as a bit line pre-charge voltage level VP1 for a node 34 between the resistor 32 and the resistor 33. Here, a switch 35 is made on in the normal operation mode, and made off in the self-refresh mode.

A bit line pre-charge voltage generation circuit 36 is used in the self-refresh mode, which comprises a VCC power line 37 for providing the lowered voltage level VII, and resistors 38 and 39. The bit line pre-charge generation circuit 36 provides a pre-charge voltage level VP2 for a node 40 between the resistors 38 and 39, where the resistors 38 and 39 have such values that VP2 is equal to VII minus half the VCC. Here, a switch 41 is made off in the normal operation mode, and made on in the self-refresh mode.

A bit line pre-charge circuit 42 comprises enhanced nMOS transistors 43, 44, and 45 whose on and off are controlled by a bit line pre-charge control signal PC. The bit line pre-charge circuit 42 further comprises a sense amplifier 46 which is a single sense amplifier forming the sense amplifier circuit 8 with other plurality of sense amplifiers.

When a pair of bit lines BL and /BL is pre-charged in the normal operation mode, the switch 35 is on, the switch 41 is off, the bit line pre-charge control signal PC is at the high level, and the nMOS transistors 43, 44, and 45 are all on. Thus, a pair of the bit lines BL and /BL is pre-charged at the bit line pre-charge voltage level VP1, which is equal to half the VCC.

When bit lines are pre-charged in the self-refresh mode, the switch 35 is off, the switch 41 is on, the bit line pre-charge control signal PC is at the high level, and the nMOS transistors 43, 44, and 45 are all on. Thus, the bit lines BL and /BL are pre-charged at the bit line pre-charge voltage level VP2, which is equal to VII minus half the VCC.

Figure 8:
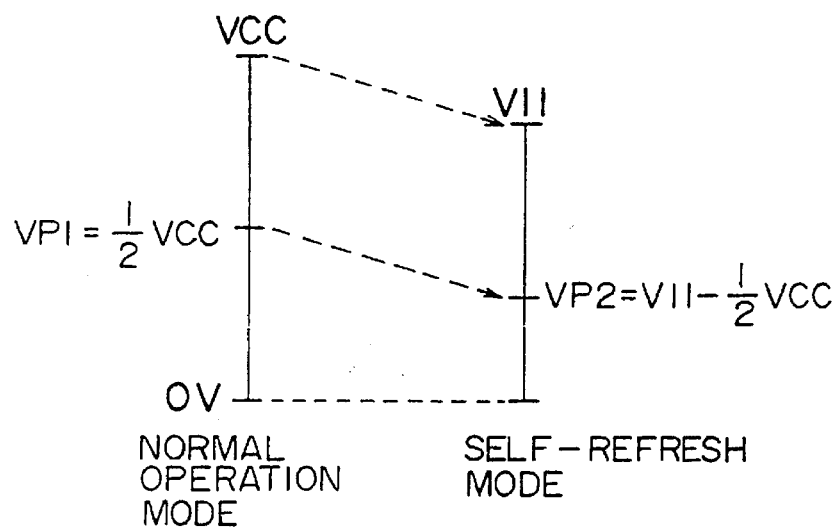
FIG. 8 is an illustrative drawing showing a relation between the bit line pre-charge voltage level in the normal operation mode and the bit line pre-charge voltage level in the self-refresh mode according to the first embodiment of the present invention.

FIG. 8 shows a relation between the bit line pre-charge voltage level VP1 of the normal operation mode and the bit line pre-charge voltage level VP2 of the self-refresh operation mode.

As can be seen in FIG. 8, a voltage level which is used as a reference for judging results of logical operations (hereinafter called a reference voltage level) is half the VCC in the normal operation mode and the VII minus half the VCC in the self-refresh mode. As it is obvious, the bit line pre-charge voltage level VP2 is half the VII when the resistors 38 and 39 are made equal in the bit line pre-charge voltage generation circuit 36.

Figure 9:
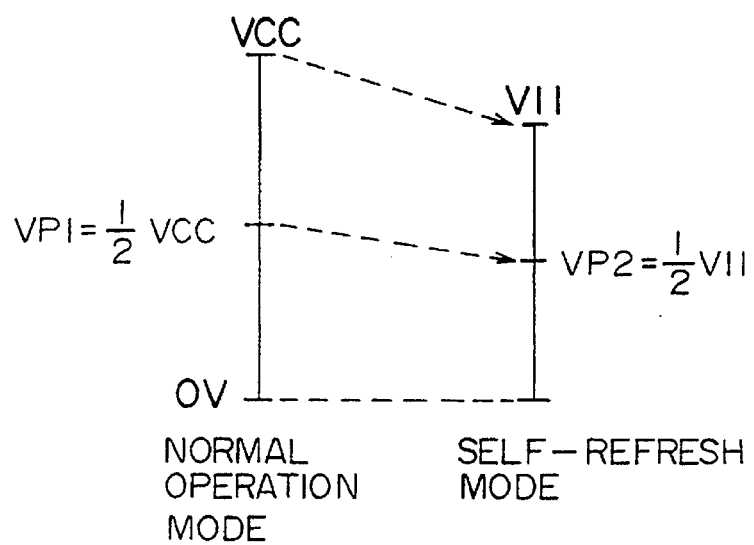
FIG. 9 is an illustrative drawing showing a relation between the bit line pre-charge voltage level in the normal operation mode and the bit line pre-charge voltage level in the self-refresh mode, when two resistors in the bit line pre-charge voltage level generation circuit of FIG. 7 have the same resistance, according to the first embodiment of the present invention.

FIG. 9 shows a relation between the bit line pre-charge voltage level VP1, equal to half the VCC, of the normal operation mode and the bit line pre-charge voltage level VP2, equal to half the VII, of the self-refresh operation mode.

As can be seen in FIG. 9, with the resistors 38 and 39 having an equal value, the reference voltage level (a reference for judging results of logical operations) is half the VCC in the normal operation mode and the half the VII in the self-refresh mode.

As described before, in the first embodiment, the power voltage level supply circuit 28 provides the internal circuits with the external power voltage level VCC in the normal operation mode. In the self-refresh mode, it provides the internal circuits with the lowered voltage level VII.

Accordingly, according to the first embodiment, a further reduction in electric power consumption can be achieved compared to the DRAM of the prior art shown in FIG. 1 in which the lowered voltage level VII is supplied only to the self-refresh circuit 15 in the self-refresh mode. Thus, the first embodiment used in portable equipment such as laptop type personal computers can enhance the usefulness of such equipment.

Since the first embodiment can achieve a reduction in electric power consumption more than DRAMs of the prior art, DRAMs according to this embodiment can operate in a better environment with regard to noise levels and the like. This allows the refresh cycle of the DRAMs to be longer than that of the prior art, which again leads to a further reduction in electric power consumption.

In this embodiment, in order for the reference voltage level to be VII minus half the VCC, the bit lines BL and /BL are pre-charged at the voltage level of VII minus half the VCC. Thus, when the capacitor 3 is at the high level and when the memory cell 2 is selected, the voltage level of a cell node 47, the voltage level of the bit lines BL and /BL, and the reference voltage level have a relation as shown in FIG. 10. As can be seen in FIG. 10, even if the voltage level of the cell node 47 drops to the level below the VII because of, for example, a gamma radiation, data stored in the memory cell 2 can be correctly judged by the sense amplifier 46. This can be done, if the voltage level of the cell node 47 is only higher than the VII minus half the VCC.

In this manner, according to the first embodiment, the reference voltage level set at the VII minus half the VCC in the self-refresh mode can bring about the enhancement of the tolerance for soft errors.

FIG. 11 shows a main part of the second embodiment of the present invention. The second embodiment differs from the first embodiment only in the part of the memory cell array unit 1 shown in FIG. 11. Other elements of the second embodiment are the same as those of the first embodiment shown in FIG. 6.

In FIG. 11, a VCC/VII power line 50 provides the external power voltage level VCC in the normal operation mode and the lowered voltage level VII in the self-refresh mode. Resistors 51 and 52 have the same resistance.

A bit line pre-charge voltage generation circuit 49 is designed to provide half the VCC as a bit line pre-charge voltage level for a node 53 between the resistors 51 and 52 in the normal operation mode. In the self-refresh mode, it provides half the VII as a bit line pre-charge voltage level. Capacitors 54 and 55 are used for setting the bit lines BL and /BL to a reference voltage level, respectively. $\emptyset_{REFS}$ is a signal for setting a pair of bit lines BL and /BL to the reference voltage level.

Figure 12A:
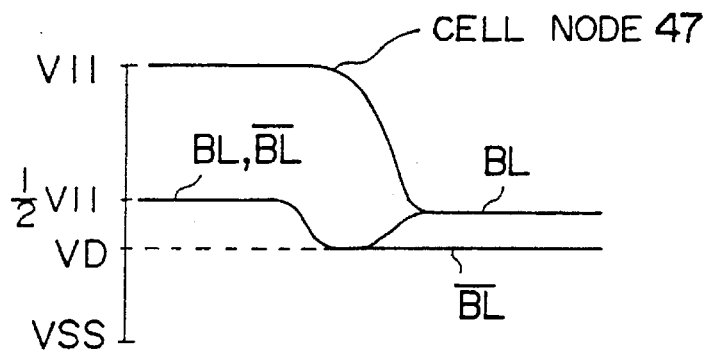
FIG. 12 is a time chart showing signals for explaining the operation of the second embodiment in the self-refresh mode.
Figure 12B:
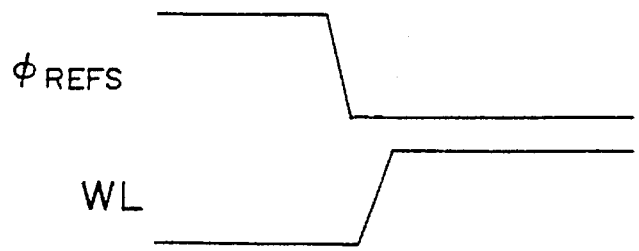
Figure 12C:

FIG. 12 shows signals for explaining the operation of the second embodiment in the self-refresh mode. FIG. 12 shows an example where the memory cell 2 is selected. In FIG. 12, the voltage levels of a cell node 47 and the bit lines BL and /BL, $\emptyset_{REFS}$, the voltage level of a word line WL are shown in this order from the top to the bottom.

In this second embodiment, a pair of the bit lines BL and /BL is pre-charged at half the VII in the self-refresh mode. Then, $\emptyset_{REFS}$ is turned from a high level to a low level. As a result, the voltage level of the bit lines BL and /BL is dragged down by the capacitors 54 and 55 to a voltage level VD lower than half the VII which is the bit line pre-charge voltage level. This voltage level VD is used as a reference voltage level in this embodiment.

Then, the word line is set to the high level, and the nMOS transistor is turned on. Then, data stored in the memory cell 2 is read out, so that the voltage level of the bit line BL goes up from the reference voltage level VD, while the bit line /BL keeps the reference voltage level VD. The difference in voltage between the bit lines BL and /BL is then sensed by the sense amplifier 46.

Here, this second embodiment also is provided with the power voltage supply circuit 28. Thus, as same as the case of the first embodiment, the second embodiment can provide internal circuits with the external power voltage level VCC in the normal operation mode and with the lowered voltage level VII in the self-refresh mode.

Accordingly, according to the second embodiment, a further reduction in electric power consumption can be achieved compared to the DRAM of the prior art shown in FIG. 1 in which the lowered voltage level VII is supplied only to the self-refresh circuit 15 in the self-refresh mode. Thus, the second embodiment used in portable equipment such as laptop type personal computers can enhance the usefulness of such equipment.

Since the second embodiment can achieve a reduction in electric power consumption more than DRAMs of the prior art, DRAMs according to this embodiment can operate in a better environment with regard to noise levels and the like. This allows the refresh cycle of the DRAMs to be longer than that of the prior art, which again leads to a further reduction in electric power consumption.

Also, in the second embodiment, the reference voltage level in the self-refresh mode is set to the voltage level VD lower than half the VII. Thus, as can the first embodiment, the second embodiment can enhance the tolerance for soft errors.

Figure 13:
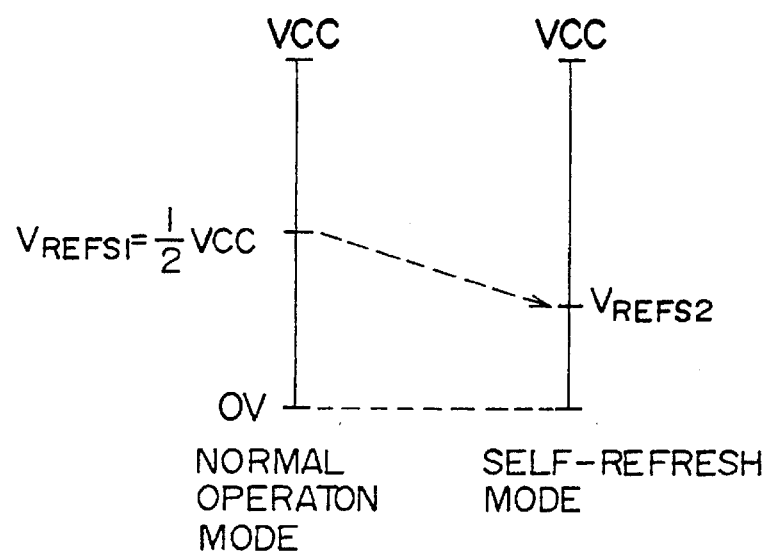
FIG. 13 is an illustrative drawing showing a relation between a reference voltage level in the normal operation mode and a reference voltage level in the self-refresh mode, when only an external power voltage level is supplied to a power line of FIG. 11.

This embodiment can be configured without the power voltage level supply circuit 28, in which case the VCC/VII power line 50 of FIG. 11 supplies only the external power voltage level VCC. A relation between a reference voltage level $V_{REFS1}$ in the normal operation mode and $V_{REFS2}$ in the self-refresh mode is shown in FIG. 13.

In the configuration without the power voltage level supply circuit 28, the reference voltage level $V_{REFS2}$ can be set to a voltage lower than half the VCC. Thus, although a reduction in electric power consumption cannot be gained, an enhancement on the tolerance for soft errors can be achieved.

FIG. 14 shows the voltage change of the cell node 47 when the power line 50 supplies only the external power voltage level VCC in the configuration without the power voltage level supply circuit 28. Since the reference voltage level $V_{REFS2}$ in the self-refresh mode is set to a voltage level lower than half the VCC, a refresh operation need not be carried out at the time TA but at the time TB. This means that the cycle of refresh operations can be made twice as long as that of the prior art, e.g., can be 32 μsec compared to 16 μsec of the prior art, as shown in FIG. 15.

Figure 16:
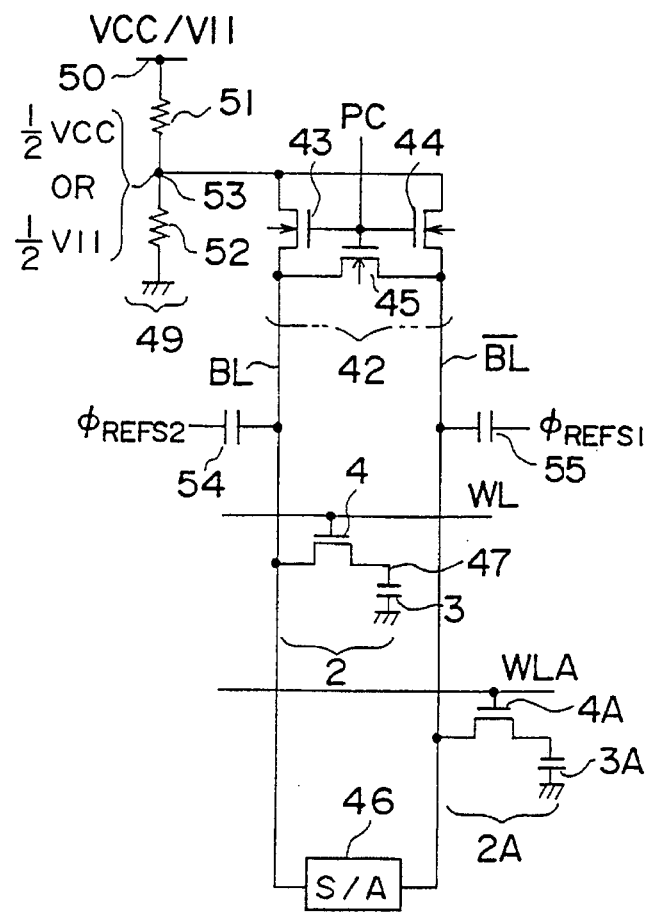
FIG. 16 is a circuit diagram of a main part of a third embodiment of the present invention.

FIG. 16 shows a main part of the third embodiment of the present invention. The third embodiment differs from the first embodiment only in the part of the memory cell array unit 1 shown in FIG. 6. Other elements of the third embodiment are the same as those of the first embodiment shown in FIG. 6.

This third embodiment is a improved version of the second embodiment shown in FIG. 11. In the third embodiment, the setting of reference voltage levels for a pair of the bit lines BL and /BL are carried out by $\emptyset_{REFS2}$ through the capacitor 54 for the bit line BL and by $\emptyset_{REFS1}$ through the capacitor 55 for the bit line /BL.

FIG. 17 shows signal for explaining the operation of the third embodiment in the self-refresh mode. FIG. 17 shows an example where the memory cell 2 is selected. At the top of FIG. 12, the voltage levels of a cell node 47 and the bit lines BL and /BL and the reference voltage level VD are shown for the case in which the memory cell 2 stores a high level. $\emptyset_{REFS1}$, $\emptyset_{REFS2}$, and the voltage level of a word line WL are shown in this order from the next to the top of FIG. 12. At the bottom of FIG. 12, the voltage levels of a cell node 47 and the bit lines BL and /BL and the reference voltage level VD are shown for the case in which the memory cell 2 stores a low level.

In this third embodiment, a pair of the bit lines BL and /BL is pre-charged at the level of half the VII in the self-refresh mode, with $\emptyset_{REFS1}$ and $\emptyset_{REFS2}$ being at the high level.

Then, $\emptyset_{REFS1}$ is turned from the high level to the low level, while $\emptyset_{REFS2}$ is kept at the high level. The voltage level of the bit line /BL is dragged down by the capacitor 55 to the voltage level VD lower than half the VII, and this voltage level VD is used as a reference voltage level. The voltage level of the bit line BL is kept at half the VII.

Then, the word line WL is set to the high level, and the nMOS transistor is turned on. Then, data stored in the memory cell 2 is read out, so that the voltage level of the bit line BL goes up from half the VII which is a bit line pre-charge voltage level, while the bit line /BL keeps the reference voltage level VD. The difference in voltage between the bit lines BL and /BL is then sensed by the sense amplifier 46.

If a memory cell coupled to the bit line /BL such as for example a memory cell 2A shown in FIG. 16 is selected, $\emptyset_{REFS2}$ is turned from the high level to the low level, while $\emptyset_{REFS1}$ is kept at the high level. Then, the voltage level of the bit line BL is dragged down by the capacitor 54 to the voltage level VD lower than half the VII, and this voltage level VD is used as a reference voltage level. The voltage level of the bit line /BL keeps half the VII.

Here, this third embodiment also is provided with the power voltage supply circuit 28. Thus, as same as the case of the first embodiment, the third embodiment can provide internal circuits with the external power voltage level VCC in the normal operation mode and with the lowered voltage level VII in the self-refresh mode.

Accordingly, according to the third embodiment, a further reduction in electric power consumption can be achieved compared to the DRAM of the prior art shown in FIG. 1 in which the lowered voltage level VII is supplied only to the self-refresh circuit 15 in the self-refresh mode. Thus, the third embodiment used in portable equipment such as laptop type personal computers can enhance the usefulness of such equipment.

Since the third embodiment can achieve a reduction in electric power consumption more than DRAMs of the prior art, DRAMs according to this embodiment can operate in a better environment with regard to noise levels and the like. This allows the refresh cycle of the DRAMs to be longer than that of the prior art, which again leads to a further reduction in electric power consumption.

Also, in the third embodiment, the reference voltage level in the self-refresh mode is set to the voltage level VD lower than half the VII. Thus, as can the second embodiment, the third embodiment can enhance the tolerance for soft errors.

As in the second embodiment, this embodiment can be configured without the power voltage level supply circuit 28, in which case the power line 50 of FIG. 16 supplies only the external power voltage level VCC.

In this case, although a reduction in electric power consumption cannot be gained, an enhancement on the tolerance for soft errors can be achieved as in the first embodiment. Also, a cycle of refresh operations can be made twice as long as that of the prior art, e.g., can be 32 μsec compared to 16 μsec of the prior art, as shown in FIG. 15.

FIG. 18 shows a block diagram of the fourth embodiment of the present invention. This embodiment is provided with the power voltage level supply circuit 57, which only differs from the prior art DRAM of FIG. 1.

In the normal operation mode, the power voltage level supply circuit 57 provides internal circuits with a lowered voltage level VIIA, which is made by lowering the external power voltage level VCC. In the self-refresh mode, it provides the internal circuits with the lowered voltage level VIIB, which is made by lowering the voltage of the external power voltage level VCC and further lower than the lowered voltage level VIIA.

In effect, however, a voltage higher than the lowered voltage level VIIA is applied to a selected word line by a voltage boosting circuit (not shown) in the normal operation mode. In the self-refresh mode also, a voltage higher than the lowered voltage level VIIB is applied to a selected word line by the voltage boosting circuit (not shown).

Figure 19:
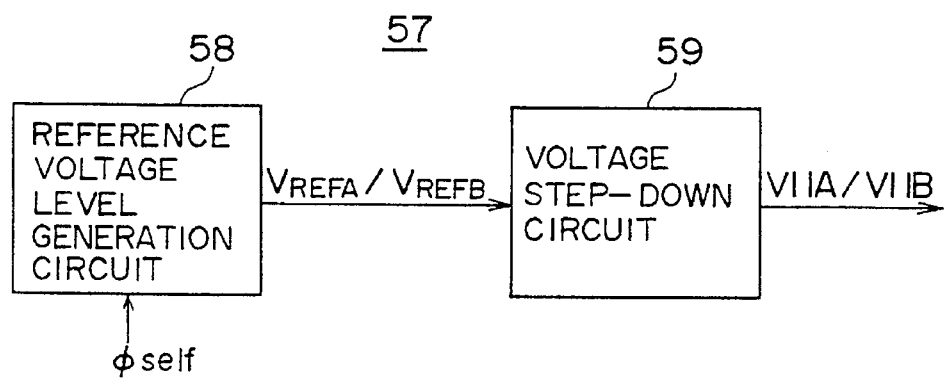
FIG. 19 is a block diagram of a power voltage level supply circuit of FIG. 18.

FIG. 19 shows a block diagram of the power voltage level supply circuit 57. In FIG. 19, a reference voltage level generation circuit 58 generates a reference voltage level $V_{REFA}$ in the normal operation mode, and, in the self-refresh mode, generates a reference voltage level $V_{REFB}$ lower than the $V_{REFA}$.

$\emptyset_{self}$ is a self-refresh detection signal for controlling the reference voltage level generation circuit 58, which is set to a low level in the normal operation mode and to a high level in the self-refresh mode. A voltage step-down circuit 59 generates the lowered voltage level VIIA (equal to $V_{REFA}$) in the normal operation mode by lowering the external power voltage level VCC on the basis of the reference voltage level $V_{REFA}$ provided by the reference voltage level generation circuit 58. In the self-refresh mode, it generates the lowered voltage level VIIB (equal to $V_{REFB}$) by lowering the external power voltage level VCC on the basis of the reference voltage level $V_{REFB}$ provided by the reference voltage level generation circuit 58.

The reference voltage generation circuit 58 has a circuit structure shown in FIG. 20. In FIG. 20, the reference voltage generation circuit 58 comprises inverters 61 to 64, a NOR gate 65, a pMOS transistor 66 which is an enhanced type having a long channel, and pMOS transistors 67 to 69 which are also an enhanced type but having a normal channel.

The reference voltage generation circuit 58 further comprises nMOS transistors 70 to 72 of an enhanced type with a normal channel, nMOS transistors 73 to 75 of an enhanced type with a long channel, and nMOS transistors 76 to 78 of a depletion type. Here, the nMOS transistors 73 and 76 form a source follower circuit in which the nMOS transistor 76 serves as a driving transistor and the nMOS transistor 73 serves as a resistance current source. Also, the nMOS transistors 74 and 77 form a source follower circuit in which the nMOS transistor 77 serves as a driving transistor and the nMOS transistor 74 serves as a resistance current source. Furthermore, the nMOS transistors 75 and 78 form a source follower circuit in which the nMOS transistor 78 serves as a driving transistor and the nMOS transistor 75 serves as a resistance current source.

Figure 21:
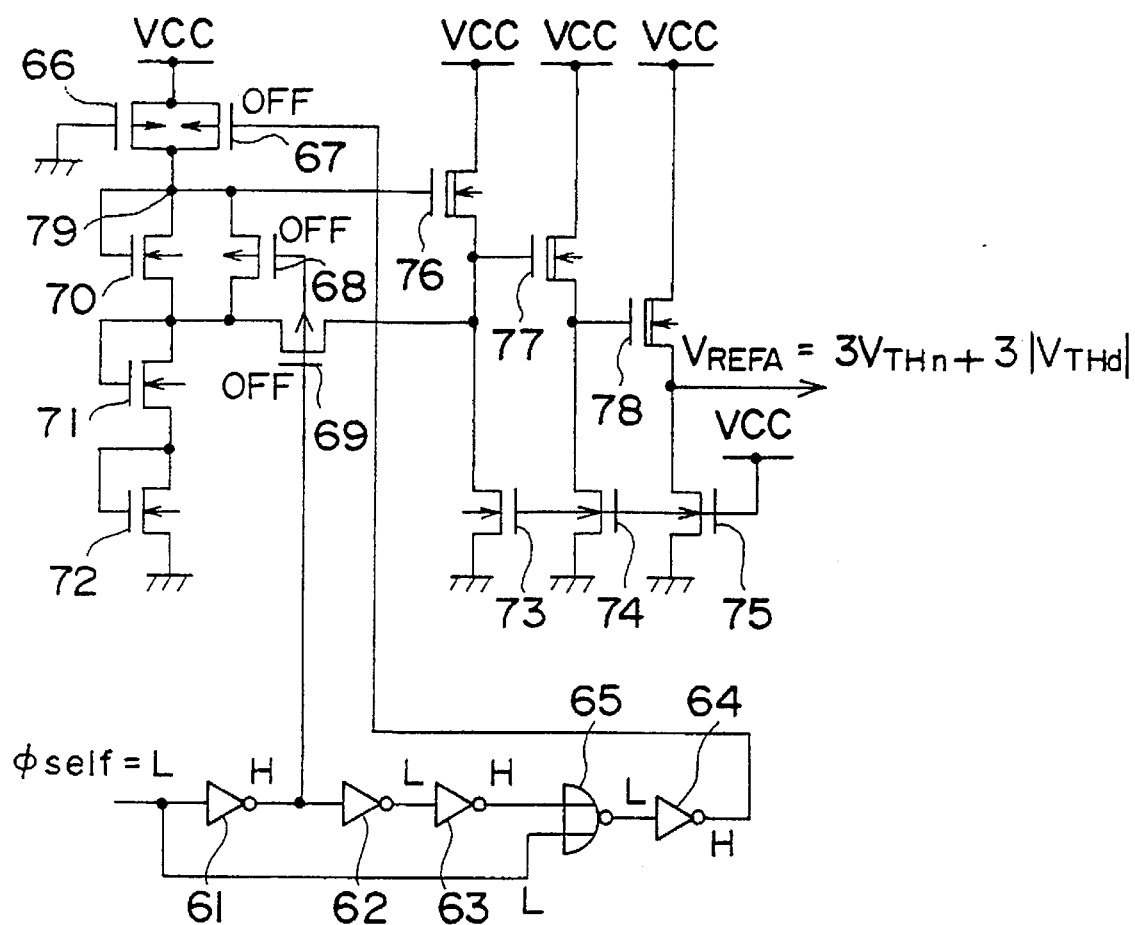
FIG. 21 is a circuit diagram for explaining the operation of the reference voltage level generation circuit of FIG. 19.

In the reference voltage level generation circuit 58, when the self-refresh detection signal $\emptyset_{self}$ is at a low level, the output of the inverter 61 is at a high level, the output of the inverter 62 is at the low level, the output of the inverter 63 is at the high level, the output of the NOR gate 65 is at the low level, the output of the inverter 64 is at the high level, and the pMOS transistors 67 through 69 are off, which are shown in FIG. 21.

Thus, in this case, the reference voltage level $V_{REFA}$ is equal to $3\ V_{THn}+3|V_{THd}|$, where the $V_{THn}$ is the threshold voltage level of the nMOS transistors 70 to 72 of an enhanced type, and the $V_{THd}$ is the threshold voltage level of the nMOS transistors 76 to 78 of a depletion type.

Figure 22:
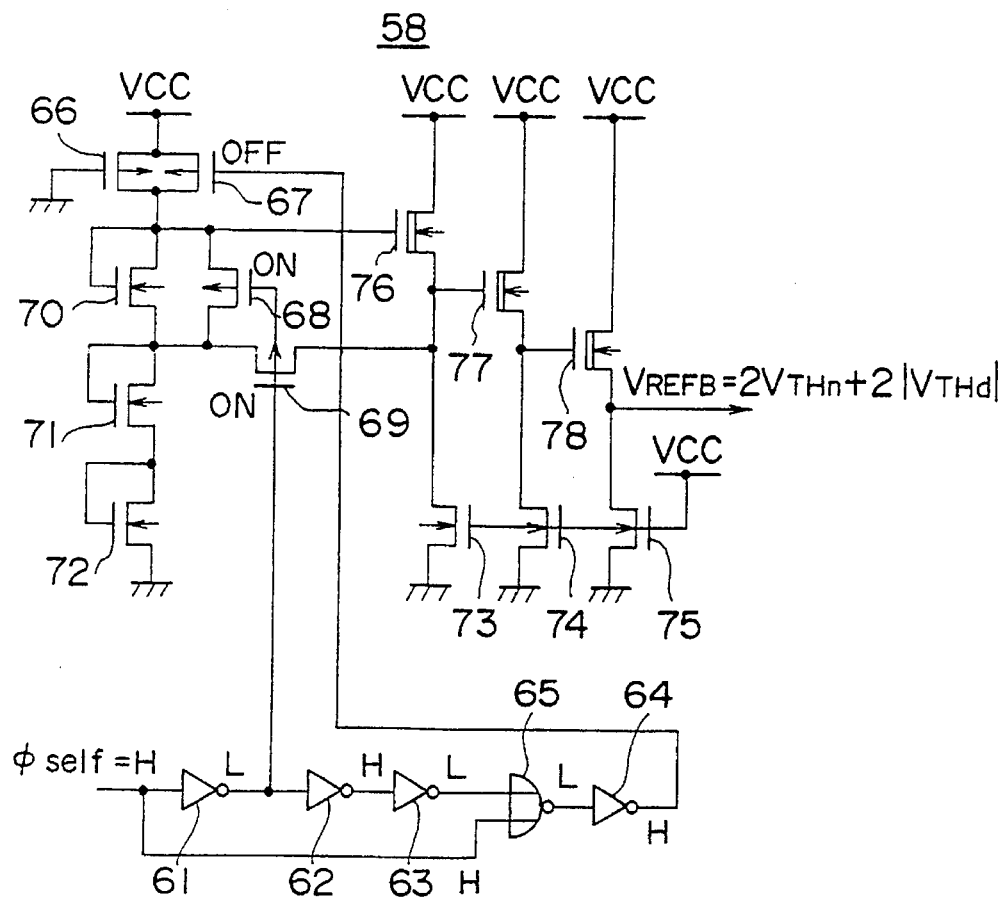
FIG. 22 is a circuit diagram for explaining the operation of the reference voltage level generation circuit of FIG. 19.

When the self-refresh detection signal $\emptyset_{self}$ is at the high level, the output of the inverter 61 is at a low level, the output of the inverter 62 is at the high level, the output of the inverter 63 is at the low level, the output of the NOR gate 65 is at the low level, the output of the inverter 64 is at the high level, as shown in FIG. 22. Thus, the pMOS transistor 67 is on and the pMOS transistors 68 and 69 are both on, and the reference voltage level $V_{REFB}$ is equal to $2\ V_{THn}+2|V_{THd}|$.

When the self-refresh detection signal $\emptyset_{self}$ is turned from the high level to the low level, i.e., when an operation mode is switched from self-refresh mode to the normal operation mode, the NOR gate 65 generates a one-shot pulse with a positive charge. As a result, a one-shot pulse with a negative charge is sent out from the inverter 64. With this negative one-shot pulse, the pMOS transistor 67 is turned on temporarily, and the voltage level of a node 79 rapidly rises up to $3\ V_{THn}$. Thus, the reference voltage quickly changes from $V_{REFB}$ ($2\ V_{THn}+2|V_{THd}|$) to $V_{REFA}$ ($3\ V_{THn}+3|V_{THd}|$).

Accordingly, when there is a transition from the self-refresh mode to the normal operation mode, an electric current required for the normal operation mode can be swiftly supplied to the internal circuits, so that a delay can be prevented which hinders a high-speed operation.

Figure 23:
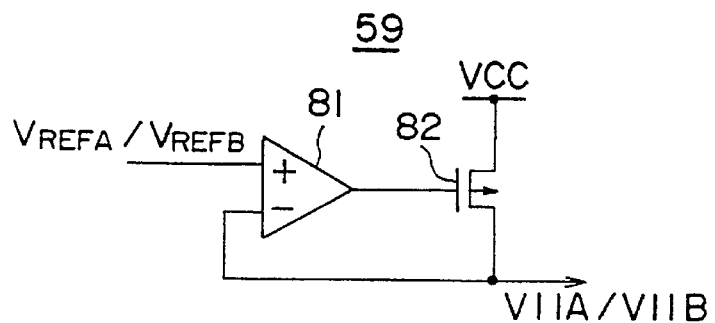
FIG. 23 is a circuit diagram of a voltage step-down circuit of FIG. 19.

FIG. 23 shows a circuit structure of the voltage step-down circuit 59. In FIG. 23, the voltage step-down circuit 59 comprises an operation amplifier 81 and a pMOS transistor 82 of an enhanced type which serves as a regulator.

In the normal operation mode, the voltage step-down circuit 59 generates the lowered voltage level VIIA, which is equal to $3\ V_{THn}+3|V_{THd}|$. In the self-refresh mode, it generates the lowered voltage level VIIB, which is equal to $2\ V_{THn}+2|V_{THd}|$.

As described above, the fourth embodiment in the normal operation mode can provide the internal circuits with the lowered voltage level VIIA, which is made by lowering the external power voltage level VCC provided externally. In the self-refresh mode, it can provide the internal circuits with the lowered voltage level VIIB, which is made by lowering the voltage of the external power voltage level VCC and further lower than the lowered voltage level VIIA.

Thus, according to the fourth embodiment, a further reduction in electric power consumption can be achieved compared to the DRAM of the prior art shown in FIG. 1 in which the lowered voltage level VII is supplied only to the self-refresh circuit 15 in the self-refresh mode. Thus, the fourth embodiment used in portable equipment such as laptop type personal computers can enhance the usefulness of such equipment.

Since the fourth embodiment can achieve a reduction in electric power consumption more than DRAMs of the prior art, DRAMs according to this embodiment can operate in a better environment with regard to noise levels and the like. This allows the refresh cycle of the DRAMs to be longer than that of the prior art, which again leads to a further reduction in electric power consumption.

In the fourth embodiment, the reference voltage level in the self-refresh mode can be set to VIIB minus half the VIIA by forming the memory cell array unit 1 as shown in FIG. 7. Also, the reference voltage level in the self-refresh mode can be set below half the VIIA by forming the memory cell array unit 1 as shown in FIG. 11 or FIG. 16. By doing so, the tolerance for soft errors can be enhanced.

In the first to fourth embodiments of the present invention, the power voltage level supply circuit in the self-refresh mode supplies a voltage level smaller than that of the normal operation mode to both the memory circuit and the self-refresh circuit. This configuration can achieve a reduction in electric power consumption in a greater amount than that of the prior art, so that those embodiments used in portable equipment such as laptop personal computers can enhance the usefulness of such equipment by prolonging the life of back-up batteries. Also, since those embodiments can achieve a greater reduction in electric power consumption than the prior art can, DRAMs can operate in a better environment in terms of the noise levels. This means that the a refresh cycle can be made longer than that of the prior art, which brings about a yet further reduction in electric power consumption.

A description of a fifth embodiment of the present invention for providing a simple method of measuring a cycle of a counter output signal will be given with reference to FIG. 24 to FIG. 41. This fifth embodiment will be explained by taking as an example the application of the present invention to a SDRAM.

FIG. 24 shows a block diagram of the fifth embodiment of the present invention. This fifth embodiment comprises a SDRAM 101, a memory cell array unit 102, an address buffer 103 for receiving an address signal. The fifth embodiment further comprises a row decoder 104 for decoding a row address signal in order to select one word line, a column decoder 105 for decoding a column address in order to select one column, a data input/output circuit 106, and a clock buffer 107 for receiving a system clock signal CLK.

The fifth embodiment further comprises a operation control circuit 108 for controlling the operation of each circuit upon receiving control signals such as a row address strobe signal /RAS, a column address strobe signal /CAS, a write enable signal /WE, etc.

The fifth embodiment further comprises a oscillator 109 and a counter 110, which keeps count of the output of the oscillator 109 and sends out a self-refresh interval signal for determining a cycle of self-refresh operations. The self-refresh interval signal is supplied to the column decoder 104, and, also, supplied to the data input/output circuit 106 as an output disable signal DIS.

In this fifth embodiment, the data input/output circuit 106 and the counter 110 are constructed as shown in FIG. 25.

In FIG. 25, the data input/output circuit 6 comprises an output unit 111, an input unit 112, an inverter 113, an OR gate 114, a NOR gate 115, a pMOS transistor 116, an nMOS transistor 117, and a data input/output node 118, where DOUT is output data and DIN is input data. The output unit 111 of the data input/output circuit 106 receives an output enable signal /EN from the operation control circuit 108, cell data DATA from the memory cell array unit 102, and an output disable signal DIS from the counter 110.

Figure 26:
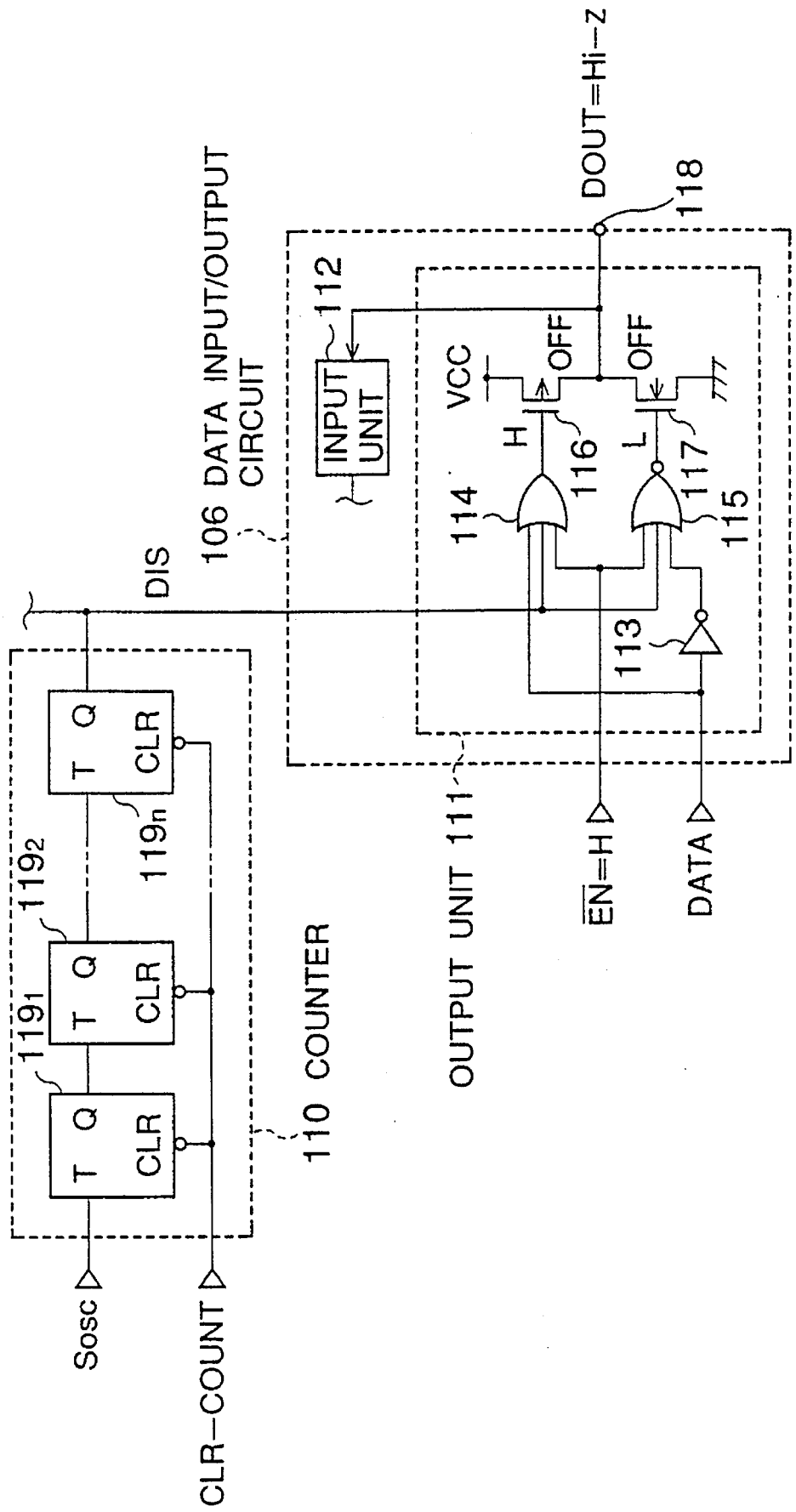
FIG. 26 is a circuit diagram for showing the operation of the data input/output circuit and the counter of FIG. 24.

As shown in FIG. 26, when the output enable signal /EN is at a high level, the output of the OR gate 114 is at the high level, the pMOS transistor 116 is off, the output of the NOR gate 115 is at a low level, and the nMOS transistor 117 is off. Thus, the output of the output unit 111 is made the high impedance state.

Figure 27:
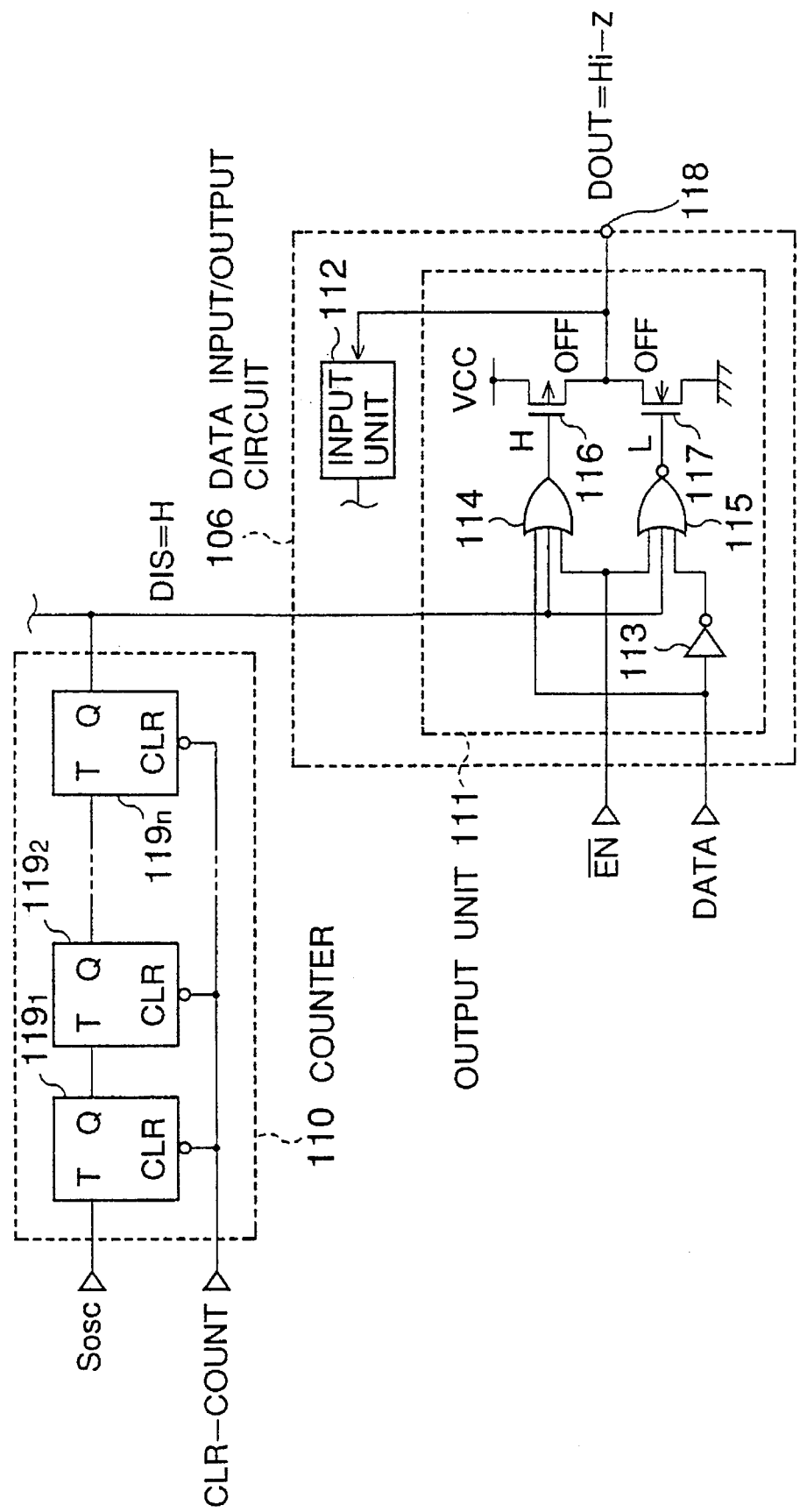
FIG. 27 is a circuit diagram for showing the operation of the data input/output circuit and the counter of FIG. 24.

As shown in FIG. 27, when the output disable signal DIS is at the high level, the output of the OR gate 114 is at the high level, the pMOS transistor 116 is off, the output of the NOR gate 115 is at the low level, and the nMOS transistor 117 is off. Thus, the output of the output unit 111 is made the high impedance state.

Figure 28:
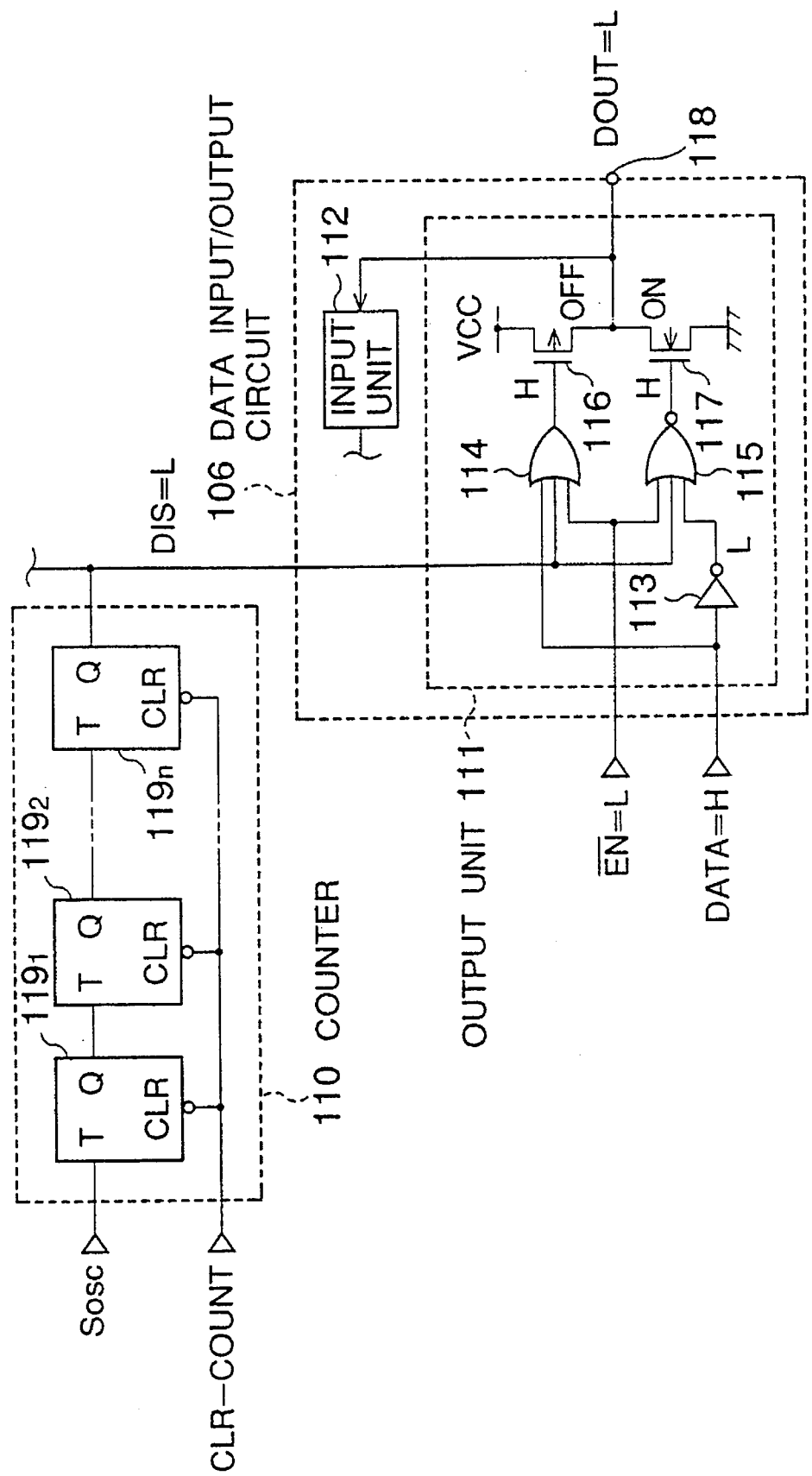
FIG. 28 is a circuit diagram for showing the operation of the data input/output circuit and the counter of FIG. 24.

As shown in FIG. 28, the memory is read-ready when the output enable signal /EN is at the low level. In the case that the cell data is at the high level, the output of the OR gate 114 is at the high level, the pMOS transistor 116 is off, the output of the inverter 113 is at the low level, the output of the NOR gate 115 is at the high level, and the nMOS transistor 117 is on. Thus, the output data DOUT becomes the low level.

Figure 29:
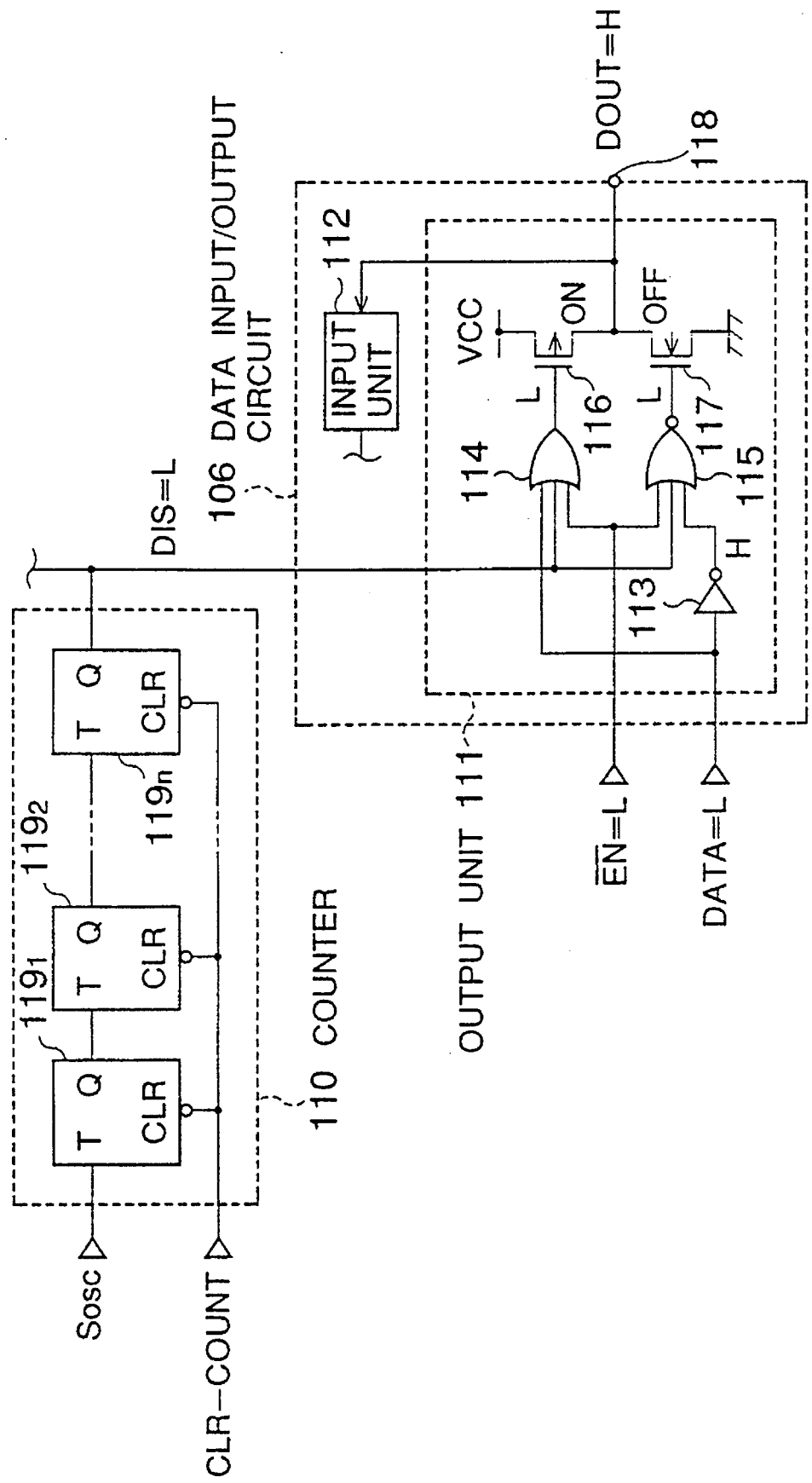
FIG. 29 is a circuit diagram for showing the operation of the data input/output circuit and the counter of FIG. 24.

On the other hand, as shown in FIG. 29, in the case that the cell data DATA is at the low level, the output of the OR gate 114 is at the low level, the pMOS transistor 116 is on, the output of the inverter 113 is at the high level, the output of the NOR gate 115 is at the low level, and the nMOS transistor 117 is off. Thus, the output data DOUT becomes the high level.

The counter 110 comprises T(toggle)-flip-flop circuits $119_1, 119_2, \ldots, 119_n$, where CLR-COUNT is a clear count signal provided by the operation control circuit 108. Here, the T-flip-flop circuits $119_3, 119_4, \ldots, 119_{n-1}$ are not shown for the clarity of the figures. The T-flip-flop circuits $119_1, 119_2, \ldots, 119_n$ all have the same circuit structure, which is shown in FIG. 30 by taking the T-flip-flop circuit $119_1$ as an example.

Figures 30, 31A, 31B, 31C:
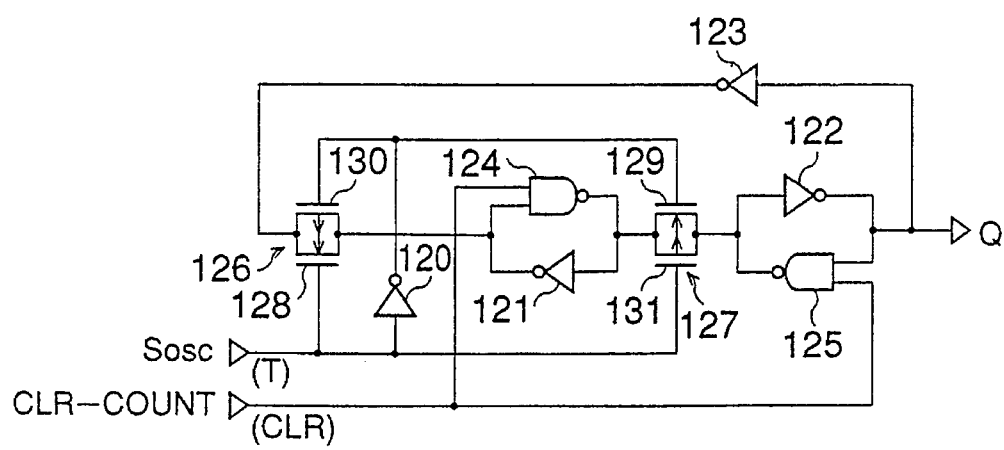
FIG. 30 is a circuit diagram of a T-flip-flop used in the counter of FIG. 24.

In FIG. 30, the T-flip-flop circuit $119_1$ comprises inverters 120 to 123, NAND gates 124 and 125, transfer gates 126 and 127, nMOS transistors 128 and 129, and pMOS transistors 130 and 131.

FIG. 31 shows signals for explaining the operation of the T-flip-flop $119_1$. In FIG. 31, the clear count signal CLR-COUNT, an oscillator output $S_{OSC}$ from the oscillator 109, an output Q of the T-flip-flop $119_1$ are shown in this order from the top to the bottom.

Figure 32:
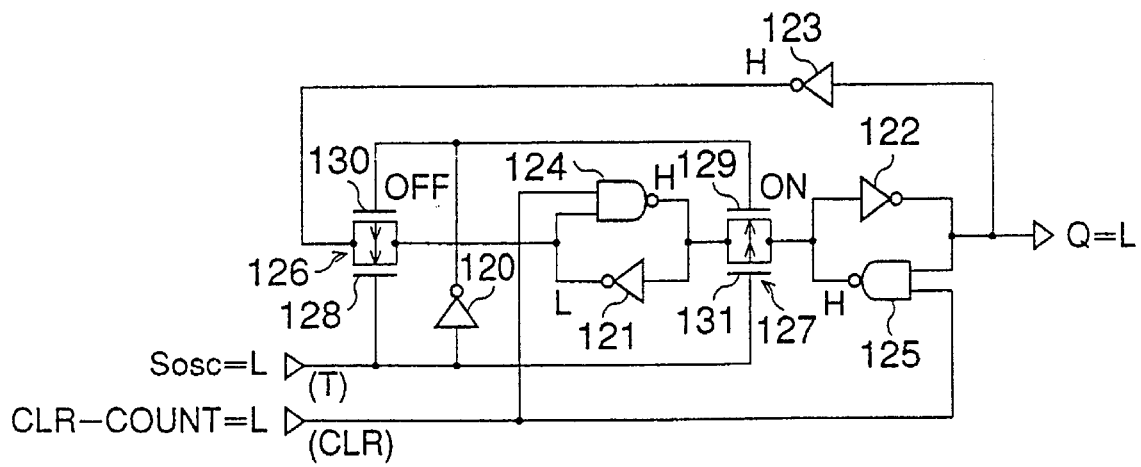
FIG. 32 is a circuit diagram for showing the operation of the T-flip-flop of FIG. 30.

As shown in FIG. 32, a situation is taken into consideration in which the oscillator output $S_{OSC}$ is at the low level, the transfer gate 126 is off, and the transfer gate 127 is on. In this case, the T-flip-flop $119_1$ is cleared when the clear count signal CLR-COUNT becomes the low level. At this point of time, the output of the NAND gate 124 is at the high level, the output of the inverter 121 is at the low level, the output Q is at the low level, the output of the NAND gate 125 is at the high level, and the output of the inverter 123 is at the high level.

Figure 33:
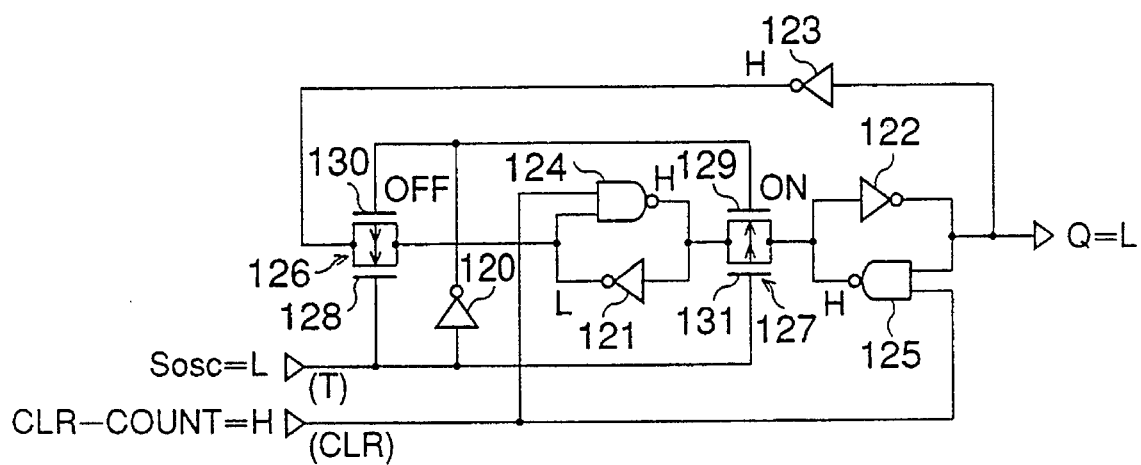
FIG. 33 is a circuit diagram for showing the operation of the T-flip-flop of FIG. 30.

As shown in FIG. 33, when the clear count signal CLR-COUNT returns to the high level, the output of the NAND gate 124 remains at the high level, the output of the inverter 121 remains at the low level, the output Q remains at the low level, the output of the NAND gate 125 remains at the high level, and the output of the inverter 123 remains at the high level.

Figure 34:
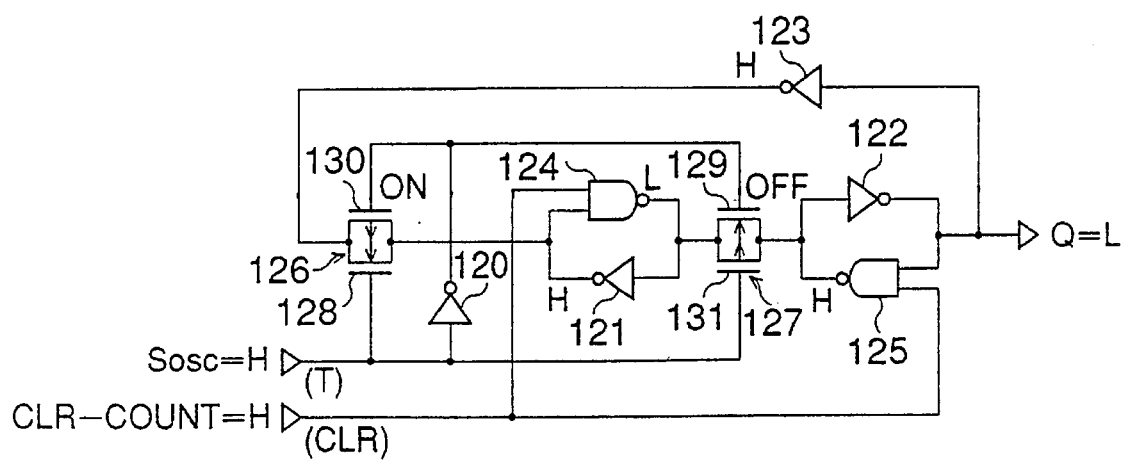
FIG. 34 is a circuit diagram for showing the operation of the T-flip-flop of FIG. 30.

Then, as shown in FIG. 34, when the oscillator output $S_{OSC}$ becomes the high level, the transfer gates 126 and 127 are made on and off, respectively. At this point of time, the output of the NAND gate 124 becomes the low level, and the output of the inverter 121 becomes the high level, while the output Q remains at the low level, the output of the NAND gate 125 remains at the high level, and the output of the inverter 123 remains at the high level.

Figure 35:
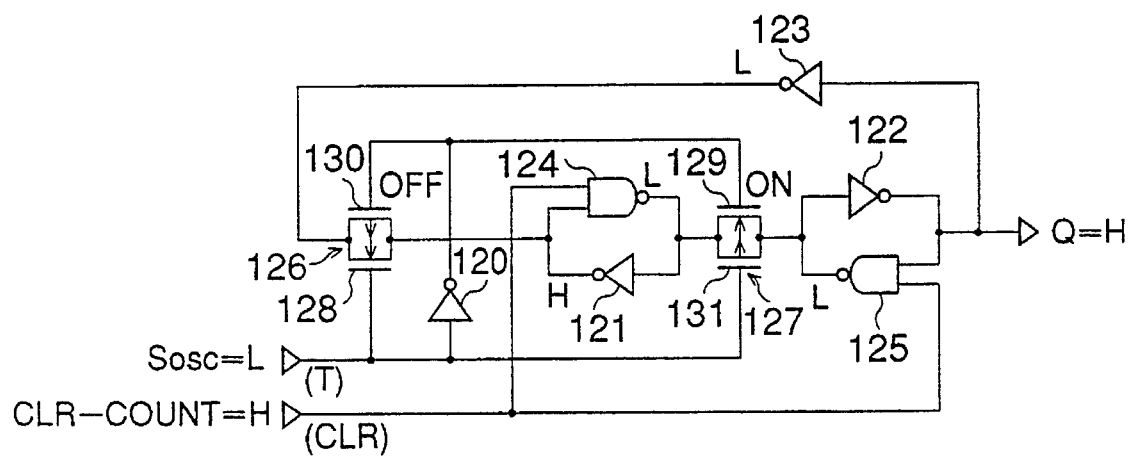
FIG. 35 is a circuit diagram for showing the operation of the T-flip-flop of FIG. 30.

Then, as shown in FIG. 35, when the oscillator output $S_{OSC}$ becomes the low level, the transfer gates 126 and 127 are made off and on, respectively. At this point of time, the output of the NAND gate 124 remains at the low level, and the output of the inverter 121 remains at the high level, while the output Q becomes the high level, the output of the NAND gate 125 becomes the low level, and the output of the inverter 123 becomes the low level.

Then, as shown in FIG. 36, when the oscillator output $S_{OSC}$ becomes the high level, the transfer gates 126 and 127 are made on and off, respectively. At this point of time, the output of the NAND gate 124 becomes the high level, and the output of the inverter 121 becomes the low level, while the output Q remains at the high level, the output of the NAND gate 125 remains at the low level, and the output of the inverter 123 remains at the low level.

Then, as shown in FIG. 37, when the oscillator output $S_{OSC}$ becomes the low level, the transfer gates 126 and 127 are made off and on, respectively. At this point of time, the output of the NAND gate 124 remains at the high level, and the output of the inverter 121 remains at the low level, while the output Q becomes the low level, the output of the NAND gate 125 becomes the high level, and the output of the inverter 123 becomes the high level.

Figure 38:
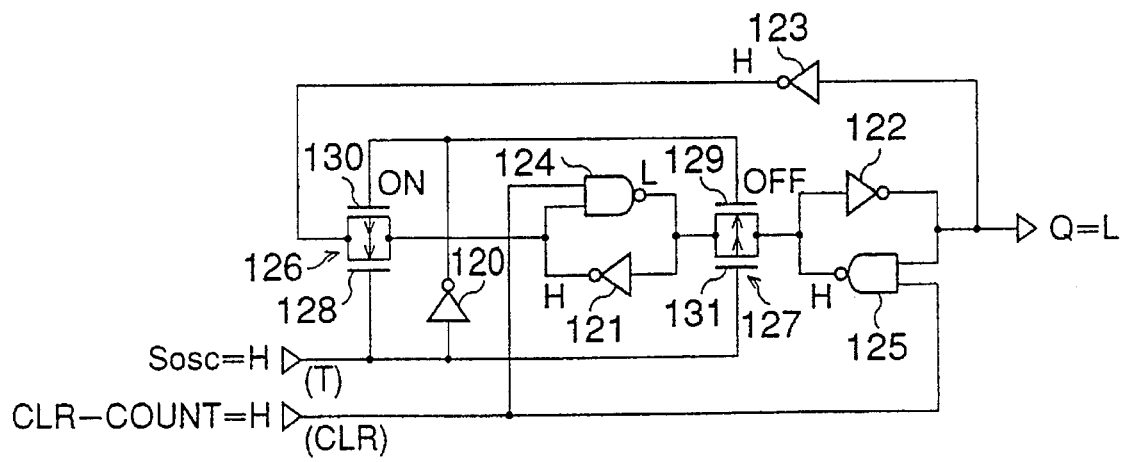
FIG. 38 is a circuit diagram for showing the operation of the T-flip-flop of FIG. 30.

Then, as shown in FIG. 38, when the oscillator output $S_{OSC}$ becomes the high level, the transfer gates 126 and 127 are made on and off, respectively. At this point of time, the output of the NAND gate 124 becomes the low level, and the output of the inverter 121 becomes the high level, while the output Q remains at the low level, the output of the NAND gate 125 remains at the high level, and the output of the inverter 123 remains at the high level.

Figure 39:
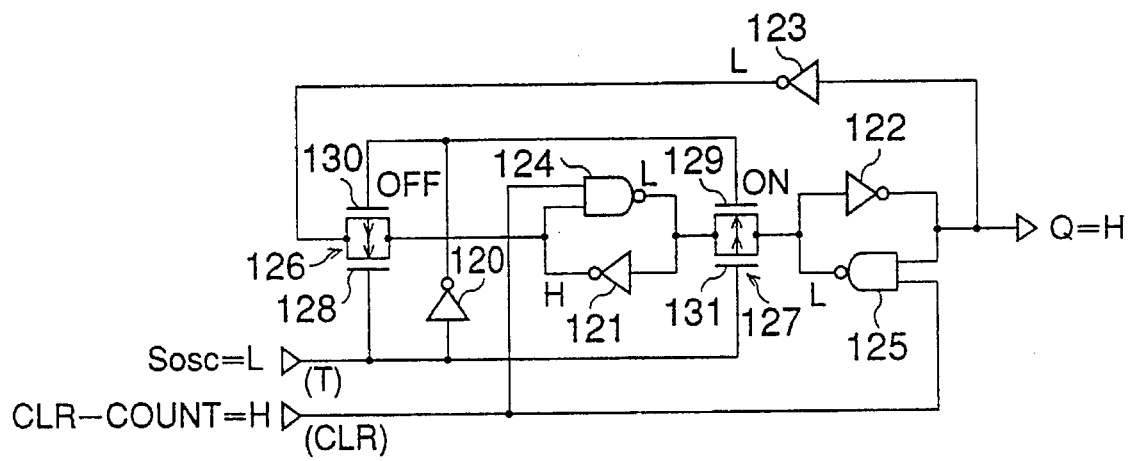
FIG. 39 is a circuit diagram for showing the operation of the T-flip-flop of FIG. 30.

Then, as shown in FIG. 39, when the oscillator output $S_{OSC}$ becomes the low level, the transfer gates 126 and 127 are made off and on, respectively. At this point of time, the output of the NAND gate 124 remains at the low level, and the output of the inverter 121 remains at the high level, while the output Q becomes the high level, the output of the NAND gate 125 becomes the low level, and the output of the inverter 123 becomes the low level.

Accordingly, the T-flip-flop $119_1$ serves as a frequency divider which halves the frequency of the oscillator output $S_{OSC}$ as shown in FIG. 31, so that the counter 110 has the same function as a frequency divider which divides the oscillator output $S_{OSC}$ by 2n.

FIG. 40 shows signals illustrating the operation of the counter 110. In FIG. 40, the clear count signal CLR-COUNT provided by the operation control circuit 108, the oscillator output $S_{OSC}$ from the oscillator 109, the output Q of the T-flip-flop $119_1$, the output Q of the T-flip-flop $119_2$, the output Q of the T-flip-flop $119_n$ (i.e., the output disable signal DIS) are provided in this order from the top to the bottom.

FIG. 41 shows a time chart for illustrating a method of measuring a cycle of the output signal of the counter 110 according to the fifth embodiment of the present invention.

From the top to the bottom of FIG. 41 are the system clock signal CLK, the row address strobe signal /RAS, the column address strobe signal /CAS, the write enable signal /WE, the clear count signal CLR-COUNT from the operation control circuit 108, the cell data DATA from the memory cell array unit 102, the output enable signal /EN from the operation control circuit 108, the output data DOUT from the output unit 111 of the data input/output circuit 106, the oscillator output $S_{OSC}$ from the oscillator 109, and the output disable signal DIS from the counter 110.

When measuring a cycle of the output signal of the counter 110 in the fifth embodiment of the present invention, what has to be done first is that the row address strobe signal /RAS is made the low level, the column address strobe signal is made the high level, and the write enable signal /WE is made the low level, so that a self-refresh instruction is given. This self-refresh instruction is read at a time T1 so as to activate the oscillator 109 and clear the counter 110 by making the clear count signal CLR-COUNT the low level.

Then, the row address strobe signal /RAS is changed to the high level, the column address strobe signal /CAS is changed to the low level, and the write enable signal /WE is changed to the high level, so that a read instruction is given. At a time T2, this read instruction is read so as to make the output enable signal /EN the low level. As a result, the output of the output unit 111 of the data input/output circuit 106 is made the data output state, and the output data DOUT is provided.

The counter 110 makes the output disable signal DIS the high level when one self-refresh cycle such as for example 16 µsec has passed in the counter 110's own time scale by counting the oscillator output $S_{OSC}$ from the moment when the counter 110 was cleared.

As a result, the output of the OR gate 114 becomes the high level, the pMOS transistor 116 is turned off, the output of the NOR gate 115 becomes the low level, and the nMOS transistor 117 is turned off. Thus, the output of the output unit 111 of the data input/output circuit 106 becomes the high impedance state.

Then, a time length is measured between the time T1 when the self-refresh signal is read and a time T3 when the output of the output unit 111 of the data input/output circuit 106 becomes the high impedance state. This time length reveals the length of time which the counter 110 regards as one self-refresh cycle such as for example 16 µsec, which it counted from the moment of clearing. Thus, a cycle of the output signal of the counter 110 is obtained.

Since the counter 110 is comprised of frequency dividers, the oscillating frequency of the oscillator 109 can be estimated by using the frequency dividing ratio. Thus, a fine adjustment of the oscillating frequency of the oscillator 109 can be carried out so as to provide from the counter 110 an output signal with a proper cycle.

Accordingly, the fifth embodiment of the present invention can provide a simple method of measuring a cycle of the output signal of the counter 110.

In the fifth embodiment described above, the counter 110 is controlled in such a way that the output of the data input/output circuit 106 is made the high impedance state when the passage of one self-refresh cycle is measured by the counter 110 counting the oscillator output from the moment of starting the refresh operation. Alternately, the output of the data input/output circuit 106 may be made the data output state, instead of the high impedance state as in the above configuration. In this case, the output of the data input/output circuit 106 is controlled to become the high impedance state when reading the self-refresh instruction. In this manner, a cycle of the output signal of the counter 110 can be measured by a method as simple as the above.

Also, in the embodiment described above, a description has been made with regard to the case of using the self-refresh instruction. Instead of using the self-refresh instruction, a special instruction can be prepared, which causes the counter 110 to be activated to start counting the oscillator output without starting the self-refresh operation. Then, the counter 110 makes the output of the data input/output circuit 106 the high impedance state when it measures the passage of one refresh cycle by counting the oscillator output.

As described above, according to the present invention, the counter for counting the oscillator output makes the output of the data output/input circuit the high impedance state or the data output state when the result of counting becomes a predetermined number. This configuration can provide a simple method of measuring a cycle of the output signal of the counter, so that a fine adjustment of the oscillating frequency of the oscillator can be carried out to provide a cycle of a proper time length.

Further, the present invention is not limited to these embodiments, but various variations and modifications may be made without departing from the scope of the present invention.

What is claimed is:

1. A DRAM (Dynamic Random Access Memory) having a plurality of memory cells comprising:

a data read/write circuit reading or writing data for the memory cells;

a self-refresh circuit refreshing data stored in the memory cells; and power supply means for supplying power supply voltage to said data read/write circuit and said self-refresh circuit, said power supply voltage having a first voltage level in a normal operation mode and a second voltage level in a self-refresh mode, wherein said second voltage level is smaller than said first voltage level.

2. The DRAM as claimed in claim 1, further comprising:

pre-charge means for pre-charging bit lines with half of said first voltage level in the normal operation mode and with less than half of said second voltage level in the self-refresh mode, wherein the bit lines are connected to the memory cells for reading or writing the data.

3. The DRAM as claimed in claim 1, further comprising:

pre-charge means for pre-charging bit lines with half of said first voltage level in the normal operation mode and half of said second voltage level in the self-refresh mode, wherein the bit lines are connected to the memory cells for reading and writing data; and capacitors each connected to a corresponding one of the bit lines for absorbing charges of the bit lines in the self-refresh mode after said pre-charge means pre-charges the bit lines so that a voltage level of the bit lines can become lower than half of said second voltage level.

4. The DRAM as claimed in claim 1, further comprising:

pre-charge means for pre-charging bit lines with half of said first voltage level in the normal operation mode and half of said second voltage level in the self-refresh mode, wherein the bit lines are pairs of a first bit line and a second bit line, each of said pairs being used for reading and writing data for a corresponding one of the memory cells, and said first bit line being connected to a corresponding one of the memory cells; and capacitors each connected to a corresponding one of the bit lines for absorbing a charge of said second bit line in the self-refresh mode after said pre-charge means pre-charges the bit lines so that a voltage level of said second bit line can become lower than half said second voltage level.

* * * * *